(12) United States Patent
Shin et al.

(10) Patent No.: US 10,515,979 B2
(45) Date of Patent: Dec. 24, 2019

(54) THREE-DIMENSIONAL SEMICONDUCTOR DEVICES WITH INCLINED GATE ELECTRODES

(71) Applicants: JoongShik Shin, Yongin-si (KR); Jihoon Park, Hwaseong-si (KR); Yong-Hoon Son, Yongin-si (KR); Jongho Woo, Hwaseong-si (KR); Euntaek Jung, Seongnam-si (KR); Junho Cha, Seongnam-si (KR)

(72) Inventors: JoongShik Shin, Yongin-si (KR); Jihoon Park, Hwaseong-si (KR); Yong-Hoon Son, Yongin-si (KR); Jongho Woo, Hwaseong-si (KR); Euntaek Jung, Seongnam-si (KR); Junho Cha, Seongnam-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 15/692,281

(22) Filed: Aug. 31, 2017

(65) Prior Publication Data
US 2018/0226424 A1    Aug. 9, 2018

(30) Foreign Application Priority Data
Feb. 3, 2017    (KR) ........................ 10-2017-0015725

(51) Int. Cl.
*H01L 27/11582*    (2017.01)
*H01L 27/11565*    (2017.01)
*H01L 21/308*    (2006.01)

(52) U.S. Cl.
CPC ...... *H01L 27/11582* (2013.01); *H01L 21/308* (2013.01); *H01L 27/11565* (2013.01)

(58) Field of Classification Search
CPC ......... H01L 27/11512; H01L 27/11548; H01L 27/11575
See application file for complete search history.

(56) References Cited

U.S. PATENT DOCUMENTS

| | | | |
|---|---|---|---|
| 7,952,136 B2 | 5/2011 | Kito et al. |
| 8,183,624 B2 | 5/2012 | Mizukami et al. |
| 8,363,481 B2 | 1/2013 | Kidoh et al. |
| 8,633,104 B2 | 1/2014 | Pyo et al. |
| 8,787,082 B2 | 7/2014 | Son et al. |
| 8,999,844 B2 | 4/2015 | Freeman et al. |
| 9,111,797 B2 | 8/2015 | Choi et al. |
| 9,236,346 B2 | 1/2016 | Hu et al. |

(Continued)

FOREIGN PATENT DOCUMENTS

| | | |
|---|---|---|
| JP | 5100080 B2 | 12/2012 |
| KR | 20130007885 A | 1/2013 |
| KR | 20130045047 A | 5/2013 |

*Primary Examiner* — Matthew L Reames
*Assistant Examiner* — John A Bodnar
(74) *Attorney, Agent, or Firm* — Myers Bigel, P.A.

(57) ABSTRACT

A three-dimensional semiconductor device includes a substrate including a cell array region and a contact region, a stack structure including gate electrodes sequentially stacked on the substrate, vertical structures penetrating the stack structure, and cell contact plugs connected to end portions of the gate electrodes in the contact region. Upper surfaces of the end portions of the gate electrodes have an acute angle with respect to an upper surface of the substrate in the cell array region.

20 Claims, 19 Drawing Sheets

(56) References Cited

U.S. PATENT DOCUMENTS

| | | | |
|---|---|---|---|
| 2012/0322252 A1* | 12/2012 | Son | H01L 27/0207 438/591 |
| 2013/0017629 A1* | 1/2013 | Pyo | H01L 21/306 438/16 |
| 2014/0061776 A1* | 3/2014 | Kwon | H01L 21/8239 257/329 |
| 2014/0191388 A1* | 7/2014 | Chen | H01L 27/11548 257/734 |
| 2015/0069499 A1* | 3/2015 | Nakaki | H01L 27/11582 257/326 |

* cited by examiner

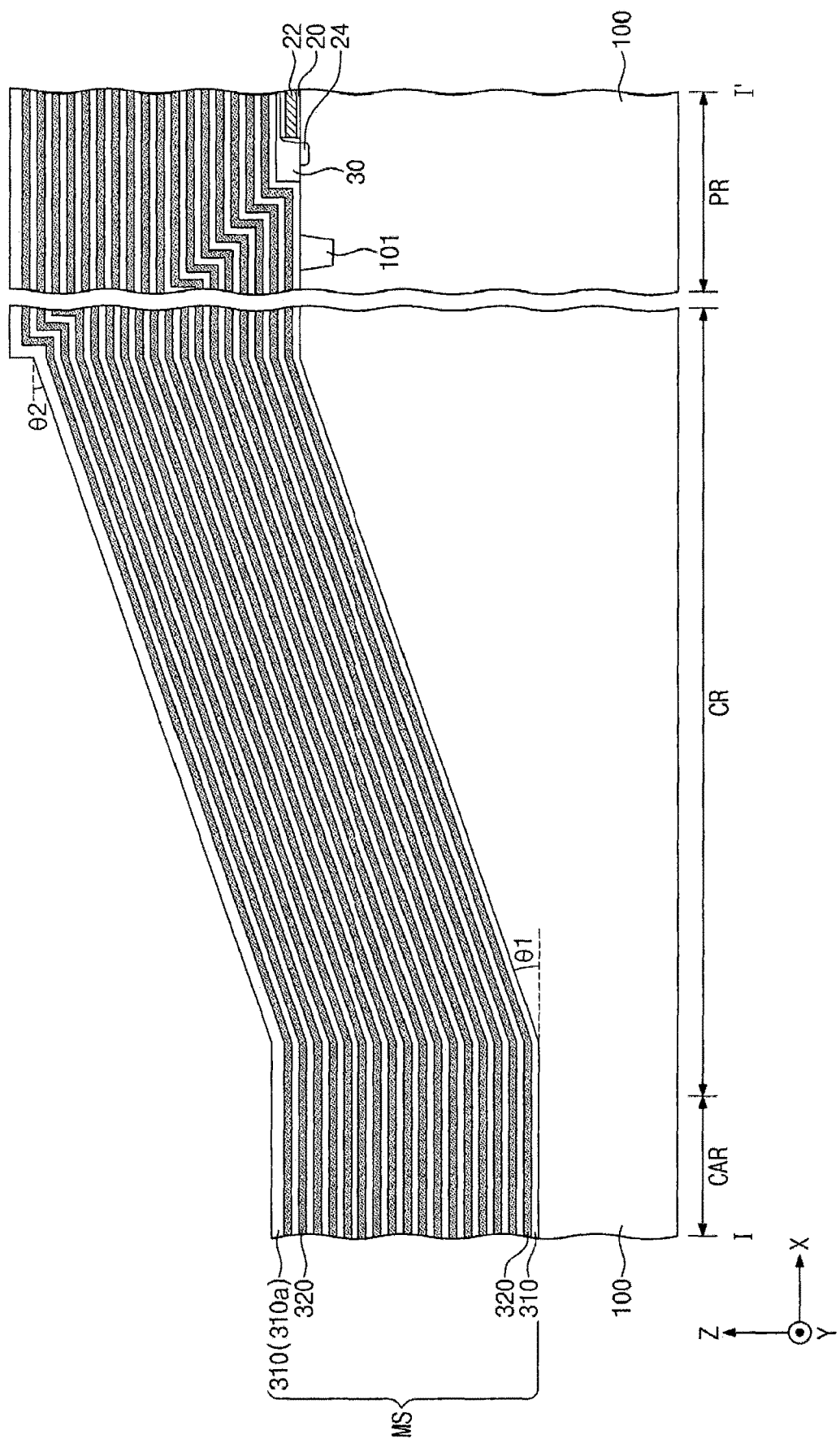

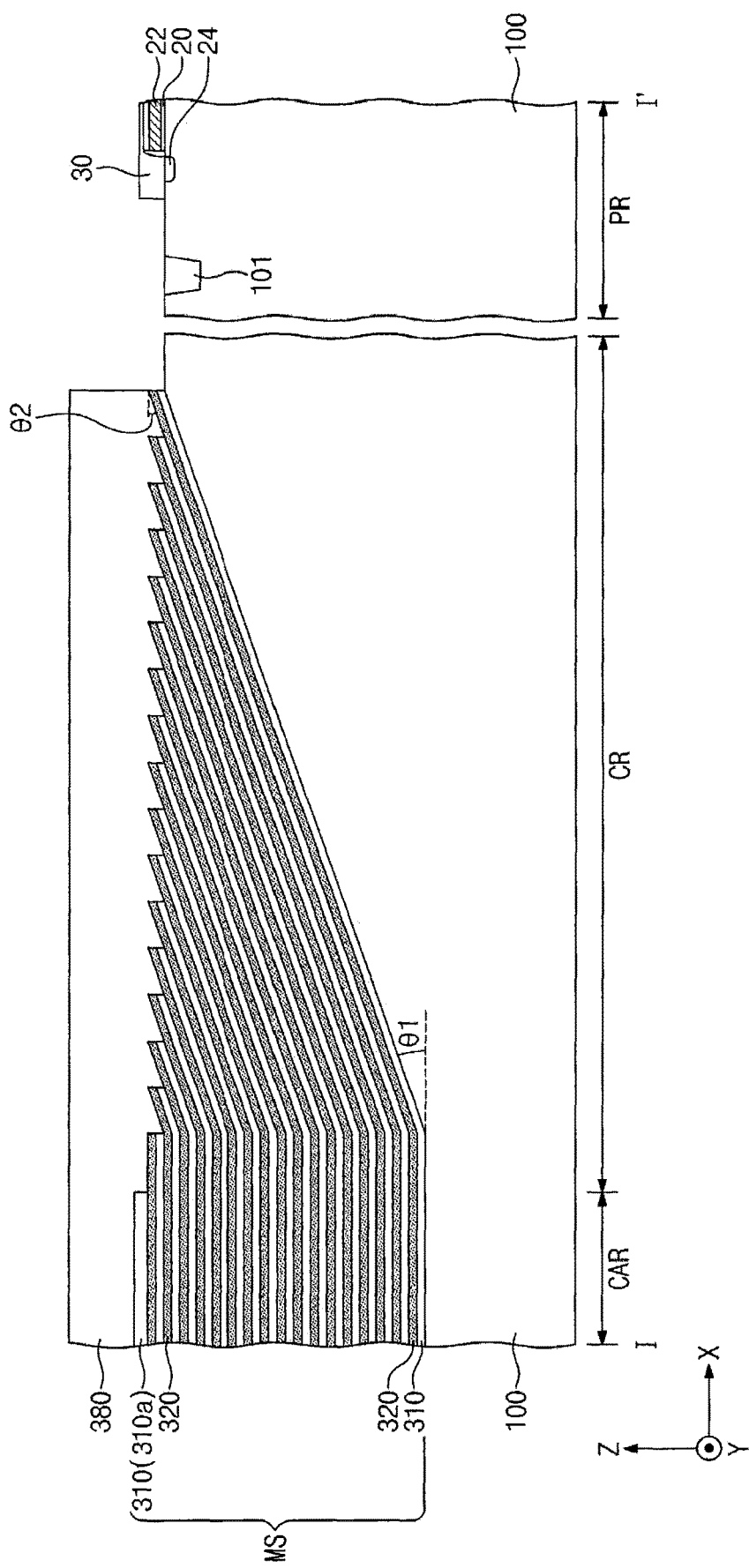

THREE-DIMENSIONAL SEMICONDUCTOR DEVICES WITH INCLINED GATE ELECTRODES

CROSS-REFERENCE TO RELATED APPLICATION

This U.S. non-provisional patent application claims priority under 35 U.S.C. § 119 to Korean Patent Application No. 10-2017-0015725 filed on Feb. 3, 2017, in the Korean Intellectual Property Office, the entire contents of which are herein incorporated by reference.

BACKGROUND

Technical Field

Example embodiments of the present inventive concepts relate to three-dimensional semiconductor devices and, more specifically, to three-dimensional semiconductor devices having improved reliability.

Discussion of Related Art

A semiconductor device may be highly integrated to meet the demands of high performance and low cost. For example, an integration degree of a two-dimensional (2D) or planar semiconductor device may be related to an area needed for a unit memory cell. Therefore, the integration density of the 2D or planar semiconductor device may be related to a technique used for the fine pattern formation of the device. However, high cost equipment may be required for such fine pattern formation in a 2D or planar semiconductor manufacturing process.

To help mitigate this limitation, a three-dimensional (3D) semiconductor device including three-dimensional memory cells has been developed. However, while reducing a manufacturing cost thereof per bit compared to two-dimensional semiconductor devices, an improved processing technique for manufacturing three-dimensional semiconductor devices having a high reliability may achieve additional benefits.

SUMMARY

According to example embodiments of the inventive concepts, a three-dimensional semiconductor memory device may include a substrate including a cell array region and a contact region, a stack structure including gate electrodes sequentially stacked on the substrate, vertical structures penetrating the stack structure, and cell contact plugs connected to end portions of the gate electrodes in the contact region. Upper surfaces of the end portions of the gate electrodes in the contact region may have an acute angle with respect to an upper surface of the substrate in the cell array region.

According to example embodiments of the inventive concepts, a three-dimensional semiconductor memory device may include a substrate including a cell array region, a peripheral circuit region and a contact region between the cell array region and the peripheral circuit region, a stack structure including gate electrodes sequentially stacked on the substrate in the cell array region and the contact region, vertical structures penetrating the stack structure, and cell contact plugs connected to end portions of the gate electrodes in the contact region. The substrate in the cell array region and contact region may have an upper surface recessed from the upper surface of the substrate in the peripheral circuit region. Upper surfaces of the end portions of the gate electrodes may be positioned at a different level from the upper surface of the substrate in the peripheral circuit region. The cell contact plugs may have a substantially same vertical length.

According to example embodiments of the inventive concepts, a three-dimensional semiconductor memory device may include a substrate comprising a cell array region and a contact region, a plurality of gate electrodes stacked on the substrate and extending from the cell array region to the contact region, and a plurality of first cell contact plugs, respective ones of the plurality of first cell contact plugs connected to respective ones of the gate electrodes in the contact region. Respective ones of the plurality of first cell contact plugs may extend a substantially equal distance to connect to the respective ones of the plurality of gate electrodes in the contact region.

BRIEF DESCRIPTION OF THE DRAWINGS

FIGS. 10A to 10I illustrate a method of manufacturing a three-dimensional semiconductor device according to example embodiments of the inventive concepts, and are cross-sectional views taken along line I-I' of FIG. 2.

DETAILED DESCRIPTION

Various example embodiments will now be described more fully with reference to the accompanying drawings in which some example embodiments are shown. However, the inventive concepts may be embodied in many alternate forms and should not be construed as limited to only example embodiments set forth herein.

Figure 1:
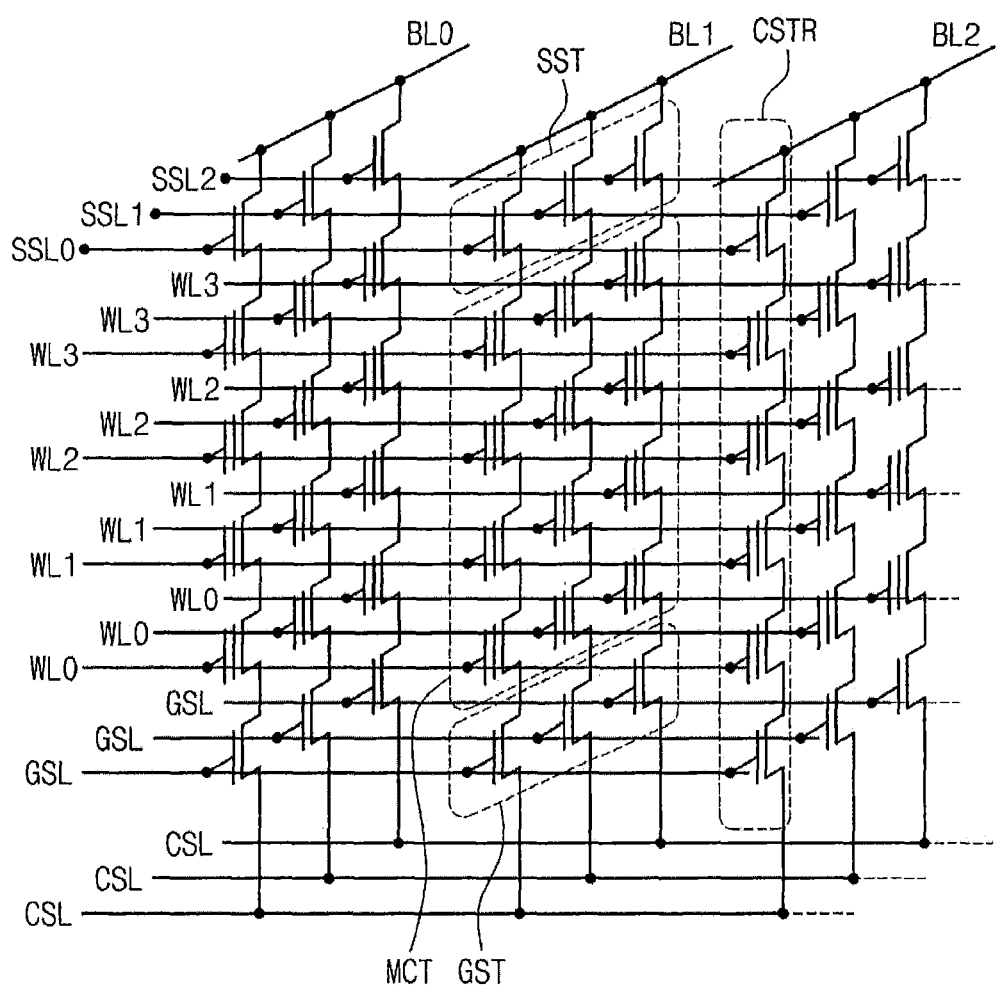
FIG. 1 is a circuit diagram illustrating a cell array of a three-dimensional semiconductor device according to example embodiments of the inventive concepts.

FIG. 1 is a circuit diagram illustrating a cell array of a three-dimensional semiconductor device according to example embodiments of the inventive concepts.

Referring to FIG. 1, a three-dimensional semiconductor device may include a common source line CSL, a plurality of bit lines BL0-BL2, and a plurality of cell strings CSTR between the common source line CSL and the bit lines BL0-BL2.

The common source line CSL may be a conductive layer on a substrate (e.g., a semiconductor substrate) or an impurity region in the substrate. The bit lines BL0-BL2 may be conductive patterns (e.g., metal lines) on the substrate and may be spaced apart from the substrate. The bit lines BL0-BL2 may be arranged in a two-dimensional array. Respective ones of the cell strings CSTR may be connected to one of the bit lines BL0-BL2. Cell strings CSTR connected to a particular bit line of the bit lines BL0-BL2 may be connected in parallel with one another.

Each of the cell strings CSTR may be constituted by a ground selection transistor GST, a string selection transistor SST connected to one of the bit lines BL0-BL2, and a plurality of memory cell transistors MCT between the ground selection transistor GST and the string selection transistor SST. The ground selection transistor GST, the string selection transistor SST, and memory cell transistors MCT may be connected in series to one another. Furthermore, the ground selection line GSL, a plurality of word lines WL0-WL3, and a plurality of string selection lines SSL0-SSL2 between the common source line CSL and the bit lines BL0-BL2 may be connected to respective gate electrodes of the ground selection transistor GST, the memory cell transistors MCT, and the string selection transistors SST.

The ground selection transistors GST may each be disposed at substantially the same distance from the substrate, and the gate electrodes thereof may be connected in common to the ground selection line GSL to be at the same potential. The ground selection line GSL may be disposed between the common source line CSL and the memory cell transistor MCT immediately adjacent thereto. The gate electrodes of the memory cell transistors MCT disposed at substantially the same distance from the common source line CSL may also be connected in common to one of the word lines WL0-WL3 to be at the same potential. Since one cell string CSTR is constituted by the plurality of memory cells MCT disposed at different distances from the common source line CSL, multi-layered word lines WL0-WL3 may be disposed between the common source line CSL and the bit lines BL0-BL2.

The ground and string selection transistors GST and SST and the memory cell transistors MCT may each be a MOS field effect transistor (MOSFET) using a channel structure as a channel region.

Though FIG. 1 illustrates three bit lines BL0-BL2, three word lines WL0-WL3, and three string selection lines SSL0-SSL2, it will be understood that these configurations are merely examples, and other quantities are possible without deviating from the inventive concepts. Similarly, it will be understood that the layout illustrated in FIG. 1 is schematic, and other physical layouts according to the inventive concepts are possible while maintaining the electrical configuration illustrated in FIG. 1.

Figure 2:
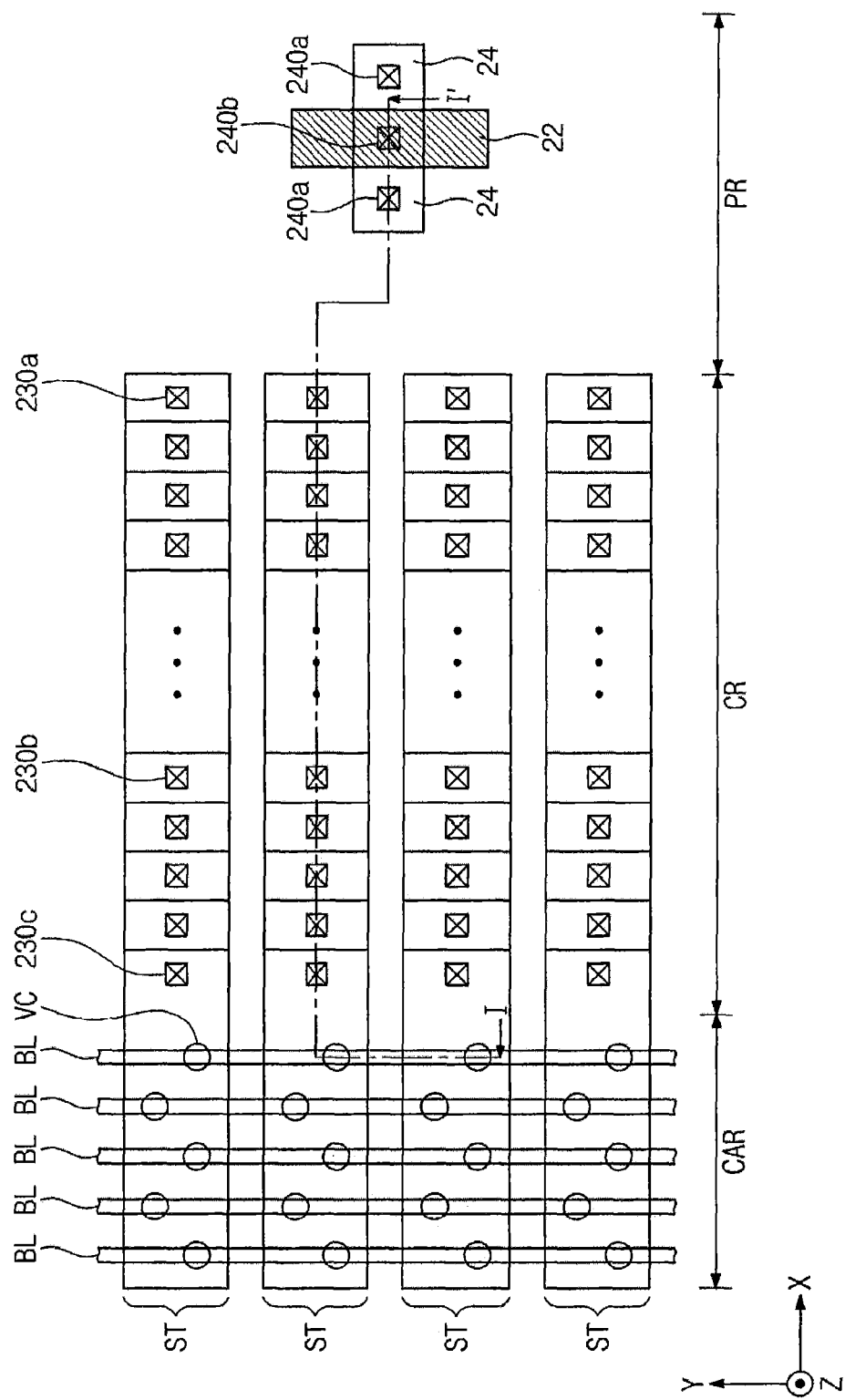
FIG. 2 is a plan view illustrating a three-dimensional semiconductor device according to example embodiments of the inventive concepts.
Figure 3:
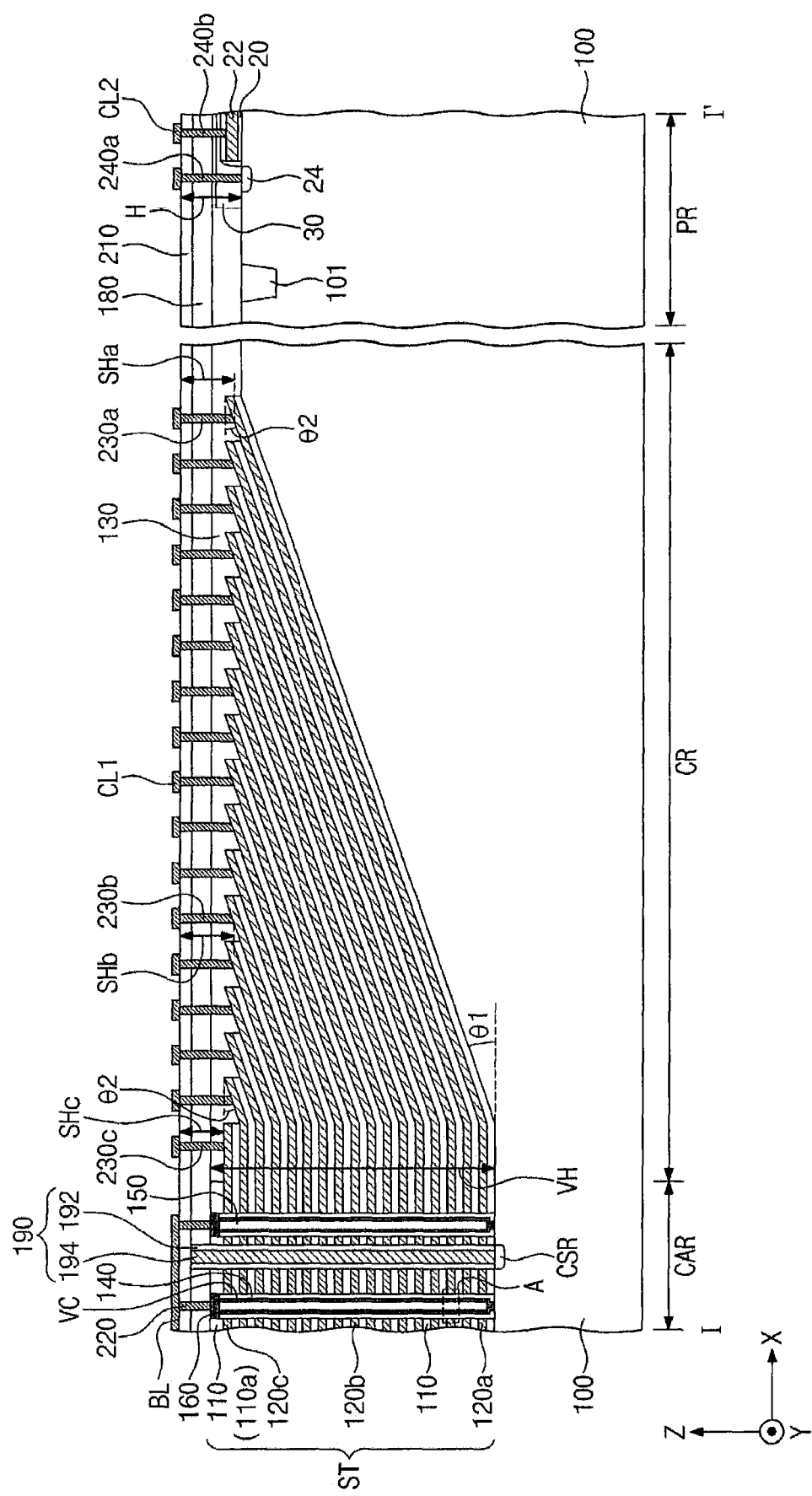
FIG. 3 illustrates a three-dimensional semiconductor device according to example embodiments of the inventive concepts, and is a cross-sectional view taken along line I-I' of FIG. 2.
Figure 4:
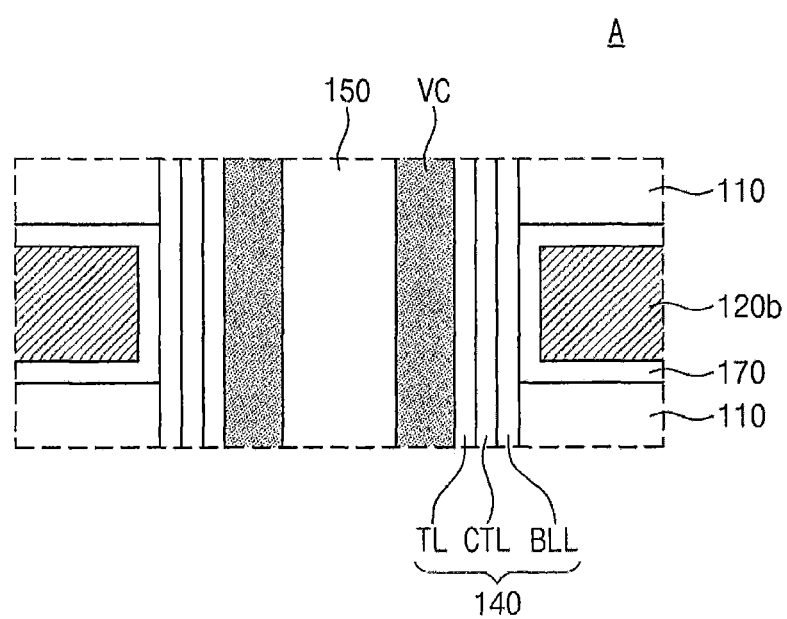
FIG. 4 is an enlarged view illustrating portion A of FIG. 3 according to example embodiments of the inventive concepts.

FIG. 2 is a plan view illustrating a three-dimensional semiconductor device according to example embodiments. FIG. 3 illustrates a three-dimensional semiconductor device according to example embodiments of the inventive concepts, and is a cross-sectional view taken along line I-I' of FIG. 2. FIG. 4 is an enlarged view illustrating portion A of FIG. 3 according to example embodiments of the inventive concepts.

Referring to FIGS. 2 and 3, a substrate 100 may include a cell array region CAR, a peripheral circuit region PR and a contact region CR between the cell array region CAR and the peripheral circuit region PR. An upper surface of the substrate 100 in the cell array region CAR and the contact region CR may be recessed from the upper surface of the substrate 100 in the peripheral circuit region PR. For example, the upper surface of the substrate 100 in the cell array region CAR may be positioned at a lower level than the upper surface of the substrate 100 in the peripheral circuit region PR. In some embodiments, the upper surface of the substrate 100 in the cell array region CAR may be parallel to the upper surface of the substrate 100 in the peripheral circuit region PR. In some embodiments, the upper surface of the substrate 100 in the contact region CR may be between the upper surface of the substrate 100 in the cell array region CAR and the upper surface of the substrate 100 in the peripheral region PR. The upper surface of the substrate 100 in the contact region CR may have a first slope angle $\theta 1$ (e.g., acute angle of about 10° to about 50°) with respect to the upper surface of the substrate 100 in the peripheral circuit region PR and/or the cell array region CAR. The substrate 100 may include a silicon substrate, a silicon-germanium substrate, a germanium substrate, or a monocrystalline epitaxial layer grown on a monocrystalline silicon substrate.

Peripheral circuit transistors may be disposed in the peripheral circuit region PR of the substrate 100. The peripheral circuit transistors may include a PMOS transistor and/or a NMOS transistor. The PMOS transistor and/or the NMOS transistor may be provided on an active region of the substrate 100 defined by an isolation layer 101. The PMOS transistor and/or the NMOS transistor may form a word line driver, a sense amplifier, row and column decoders, and/or controller circuits.

The peripheral transistors may each include a peripheral gate insulating layer 20, a peripheral gate electrode 22, and/or source/drain regions 24. The peripheral gate insulating layer 20 may be disposed on the upper surface of the substrate 100 in the peripheral circuit region PR. The peripheral gate insulating layer 20 may include, for example, silicon oxide, thermal oxide, and/or a high dielectric material (e.g., aluminum oxide ($Al_2O_3$) and/or hafnium oxide ($HfO_2$)). The peripheral gate electrode 22 may be disposed on the peripheral gate insulating layer 20. The peripheral gate electrode 22 may include, for example, doped polysilicon and/or metal. The source/drain regions 24 may be disposed in the substrate 100 at opposite sides of the peripheral gate electrode 22. The source/drain regions 24 may have a different conductivity from that of the substrate 100.

The peripheral insulating pattern 30 may be disposed on the peripheral transistors. For example, the peripheral insulating pattern 30 may be on and/or cover the peripheral gate insulating layer 20, the peripheral gate electrode 22 and/or the source/drain regions 24. In some embodiments, the peripheral insulating pattern 30 may be locally disposed in the peripheral circuit region PR to expose the upper surface of the substrate 100 in cell array region CAR and the contact region CR The peripheral insulating pattern 30 may include, for example, silicon oxide.

Stack structures ST may be disposed in the cell array region CAR and the contact region CR. The stack structures ST may extend in a first direction X on the substrate 100 and may be spaced apart from one another in a second direction Y crossing the first direction X. A common source region CSR may be disposed in a portion of the substrate 100 between the stack structures ST. The common source region CSR may extend in the first direction X. The common source region CSR may have a different conductivity from that of the substrate 100.

The stack structures ST may each include insulating patterns 110 and 110*a* and gate electrodes 120*a*, 120*b*, and 120*c* that are alternately and repeatedly stacked on the substrate 100. The insulating patterns 110 and 110*a* may be stacked on the substrate 100 in a third direction Z vertical to the upper surface of the substrate 100 in the cell array region CAR. The insulating pattern 110*a* may be an uppermost (e.g., farthest from the upper surface of the substrate 100) insulating pattern of the insulating patterns 110. The insulating patterns 110 and 110*a* may include, for example, silicon oxide.

The gate electrodes 120*a*, 120*b*, and/or 120*c* may respectively be disposed between the insulating patterns 110 and 110*a*. The gate electrodes 120*a*, 120*b*, and/or 120*c* may include a ground selection gate electrode 120*a*, a string selection gate electrode 120*c*, and/or cell gate electrodes 120*b* between the ground selection gate electrode 120*a* and the string selection gate electrode 120*c*. The ground selection gate electrode 120*a* may correspond to a lowermost (e.g., closest to the upper surface of the substrate 100) gate electrode among the gate electrodes 120*a*, 120*b*, and 120*c*, and the string selection gate electrode 120*c* may correspond to an uppermost (e.g., farthest from the upper surface of the substrate 100) gate electrode among the gate electrodes 120*a*, 120*b*, and 120*c*. The ground selection gate electrode 120*a* may correspond to the ground selection line GSL shown in FIG. 1. The cell gate electrodes 120*b* may correspond to the word lines WL shown in FIG. 1. The string selection gate electrode 120*c* may correspond to the string selection line SSL shown in FIG. 1.

Lengths of the gate electrodes 120*a*, 120*b*, and/or 120*c* in the first direction X may be different from one another. For example, the lengths of the gate electrodes 120*a*, 120*b*, and/or 120*c* in the first direction X may decrease in a direction away from the substrate 100. Thus, the length of the ground selection gate electrode 120*a* in the first direction X may be the greatest among the gate electrodes 120*a*, 120*b*, and/or 120*c*, the length of the string selection gate electrodes 120*c* in the first direction X may be the smallest among the gate electrodes 120*a*, 120*b*, and/or 120*c*. Each of the gate electrodes 120*a*, 120*b*, and/or 120*c* may be substantially the same as a length in the first direction X of the insulating pattern 110 immediately below each of the gate electrodes 120*a*, 120*b*, and/or 120*c*.

End portions of the gate electrodes 120*a*, 120*b*, and/or 120*c* may be exposed in the contact region CR of the substrate 100. In some embodiments, upper surfaces of the end portions of the ground selection gate electrodes 120*a* and the cell gate electrodes 120*b* may be sloped with respect to the upper surface of the substrate 100 in cell array region CAR and the peripheral circuit region PR. For example, the upper surfaces of the end portions of the ground selection gate electrodes 120*a* and the cell gate electrodes 120*b* may have a second slope angle θ2 (e.g., an acute angle of about 10° to about 50°) with respect to the upper surface of the substrate 100 in the cell array region CAR and the peripheral circuit region PR. The upper surface of the end portions of the ground selection gate electrodes 120*a* and the cell gate electrodes 120*b* may be substantially parallel to the upper surface of the substrate 100 in the contact region CR. In some embodiments, an end portion of each of the stack structures ST in the contact region CR may have a saw tooth shape.

An upper surface of the end portion of the string selection gate electrode 120*c* may be substantially flat relative to the upper surface of the substrate 100 in the cell array region CAR and the peripheral circuit region PR The second slope angle θ2 of the upper surfaces of the end portions of the ground selection gate electrodes 120*a* and the cell gate electrodes 120*b* may be greater than a slope angle (e.g., about 0°) of the upper surface of the end portion of the string selection gate electrode 120*c*, with respect to the upper surface of the substrate 100 in the cell array region CAR and the peripheral circuit region CR.

Sidewalls of the end portions of the gate electrodes 120*a*, 120*b*, and 120*c* may have a right angle (e.g., 90°) with respect to the upper surface of the substrate 100 in the cell array region CAR and the peripheral circuit region PR.

In some embodiments, heights of the end portions of the ground selection gate electrode 120*a* and the cell gate electrodes 120*b* from the upper surface of the substrate 100 in the cell array region CAR and/or the peripheral circuit region PR may be substantially equal to one another. For example, maximum heights of the end portions of the ground selection gate electrode 120*a* and the cell gate electrodes 120*b* from the upper surface of the substrate 100 of the cell array region CAR and/or the peripheral circuit region PR may be substantially equal to one another. Stated another way, in some embodiments, a vertical distance between the upper surface of the substrate 100 in the cell array region CAR and the respective end portions of the ground selection gate electrodes 120*a* and the cell gate electrodes 120*b* may be substantially equal, and a vertical distance between the upper surface of the substrate 100 in the peripheral circuit region PR and the respective end portions of the ground selection gate electrodes 120*a* and the cell gate electrodes 120*b* may be substantially equal. In some embodiments, minimum heights of the end portions of the ground selection gate electrodes 120*a* and the cell gate electrodes 120*b* from the upper surface of the substrate 100 in the cell array region CAR and/or the peripheral circuit region PR may be substantially equal to one another. As used herein, the minimum height of the ground selection gate electrodes 120*a* and/or the cell gate electrodes 120*b* may be a height of a lowermost edge of a sidewall of the end portions of the ground selection gate electrodes 120*a* and/or the cell gate electrodes 120*b*.

In some embodiments, a height of the end portion of the string selection gate electrode 120*c* from the upper surface of the substrate 100 in the cell array region CAR and/or the peripheral circuit region PR may be substantially equal to the maximum heights of the end portions of the ground selection gate electrodes 120*a* and the cell gate electrodes 120*b*. In other embodiments, a height of the end portion of the string selection gate electrode 120*c* from the upper surface of the substrate 100 in the cell array region CAR and/or the peripheral circuit region PR may be greater than the maximum heights of the end portions of the ground selection gate electrodes 120*a* and the cell gate electrodes 120*b*.

In some embodiments, as shown in drawings, the upper surfaces of the end portions of the gate electrodes 120*a*, 120*b*, and/or 120*c* may be positioned at a higher level than the upper surface of the substrate 100 in the peripheral circuit region PR. In some embodiments, the upper surfaces of the end portions of the gate electrodes 120*a*, 120*b*, and/or 120c may be positioned at a lower level than the upper surface of the substrate 100 in the peripheral circuit region PR.

An interlayer insulating pattern 130 may be disposed on the substrate 100 in the contact region CR and the peripheral circuit region PR. The interlayer insulating pattern 130 may cover the peripheral insulating pattern 30, the upper surface of the substrate 100 in the peripheral circuit region PR, the upper surfaces and the sidewalls of the end portions of the gate electrodes 120a, 120b, and 120c, and sidewalls of end portions of the insulating patterns 110 and 110a. An upper surface of the interlayer insulating pattern 130 may be substantially coplanar with an upper surface of the uppermost insulating pattern 110a of the insulating patterns 110 and 110a.

In some embodiments, a height of the interlayer insulating pattern 130 from the upper surface of the substrate 100 in the peripheral circuit region PR may be smaller than a vertical thickness VH of each of the stack structures ST from the upper surface of the substrate 100 in the cell array region CAR. The vertical thickness VH of the stack structure ST may correspond to a minimum vertical distance from the upper surface of the substrate 100 in the cell array region CAR to the upper surface of the uppermost insulating pattern 110a. The interlayer insulating pattern 130 may include, for example, silicon oxide.

Vertical channel structures VC may penetrate each of the stack structures ST. The vertical channel structures VC may be arranged in zigzag manner or in a line. The vertical channel structures VC may have a hollow pipe shape, a cylindrical shape, or a cup shape, but the inventive concepts are not limited thereto. The vertical channel structures VC may be electrically connected to the substrate 100. The vertical channel structures VC may include a single layer or multiple layers. The vertical channel structures VC may include a monocrystalline silicon layer, an organic semiconductor layer, and/or a carbon nano-structure.

Charge storage structures 140 may be disposed between the vertical channel structures VC and the gate electrodes 120a, 120b, and 120c. The charge storage structures 140 may extend in the third direction Z on outer sidewalls of the vertical channel structures VC. For example, the charge storage structures 140 may surround the outer sidewalls of the vertical channel structures VC. The charge storage structures 140 may each include a single layer or multiple layers, which may include, for example, silicon oxide, silicon nitride, silicon oxynitride and/or a high-k dielectric material.

For example, as shown in FIG. 4, the charge storage structures 140 may each include a tunnel insulating layer TL, a blocking insulating layer BLL, and a charge storage layer CTL. The tunnel insulating layer TL may be disposed adjacent to each of the vertical channel structures VC and may surround the outer sidewall of each of the vertical channel structures VC. The blocking insulating layer BLL may be disposed adjacent to the gate electrodes 120a, 120b, and 120c. The charge storage layer CTL may be disposed between the tunnel insulating layer TL and the blocking insulating layer BLL. The tunnel insulating layer TL may include, for example, silicon oxide and/or a high-dielectric material such as aluminum oxide ($Al_2O_3$) and/or hafnium oxide ($HfO_2$). The blocking insulating layer BLL may include for example, silicon oxide and/or a high-dielectric material such as aluminum oxide ($Al_2O_3$) and/or hafnium oxide ($HfO_2$). The charge storage layer CTL may include, for example, silicon nitride.

Gap fill layers 150 may be disposed in inner spaces surrounded by the vertical channel structures VC. The gap fill layers 150 may include an insulating material, for example, silicon oxide, silicon nitride, and/or silicon oxynitride. Pads 160 may be disposed over the vertical channel structures VC, the charge storage structures 140, and the gap fill layers 150. The pads 160 may be electrically connected to the vertical channel structures VC. The pads 160 may include a conductive material and/or a semiconductor material doped with impurities of a conductivity type different from that of the vertical channel structures VC.

As shown in FIG. 4, a horizontal insulating layer 170 may be disposed between the charge storage structure 140 and the gate electrodes 120a, 120b, and 120c and may extend onto the upper surfaces and lower surfaces of the gate electrodes 120a, 120b, and 120c. The horizontal insulating layer 170 may include for example, silicon oxide and/or a high-dielectric material such as aluminum oxide ($Al_2O_3$) and/or hafnium oxide ($HfO_2$).

A first interlayer insulating layer 180 may be disposed on the stack structures ST and the interlayer insulating pattern 130. The first interlayer insulating layer 180 may be on and/or cover the upper surface of the interlayer insulating pattern 130 and the upper surface of the uppermost insulating pattern 110a. The first interlayer insulating layer 180 may include, for example, silicon oxide.

A contact structure 190 may be disposed between the stack structures ST. The contact structures 190 may extend in the first direction X and may penetrate the first interlayer insulating layer 180. When viewed in plan view, the contact structure 190 may have a rectangular shape or a linear shape. In some embodiments, a plurality of contact structures 190 may be disposed on the substrate 100. The contact structures 190 may be arranged in the first direction X along the common source region CSR to be spaced apart from each other and, in some embodiments, may have a pillar shape.

The contact structure 190 may include a spacer 192 and a common source contact 194. The common source contact 194 may be electrically connected to the common source region CSR. The common source contact 194 may include, for example, metal such as tungsten, copper and/or aluminum, and/or transition metal such as titanium or tantalum. The spacer 192 may enclose an outer sidewall of the common source contact 194. The spacer 192 may include, for example, silicon oxide and/or silicon nitride.

A second interlayer insulating layer 210 may be disposed on the first interlayer insulating layer 180. The second interlayer insulating layer 210 may be on and/or cover an upper surface of the first interlayer insulating layer 180 and an upper surface of the contact structure 190. The second interlayer insulating layer 210 may include, for example, silicon oxide.

Channel contact plugs 220 may be disposed on the pads 160. The channel contact plugs 220 may penetrate the first and second interlayer insulating layers 180 and 210 to be electrically connected to the pads 160. The channel contact plugs 220 may include, for example, metal such as copper or tungsten, and/or metal nitride such as titanium nitride, tantalum nitride, and/or tungsten nitride.

Cell contact plugs 230a, 230b, and 230c may be disposed on the end portions of the gate electrodes 120a, 120b, and 120c in the contact region CR. The cell contact plugs 230a, 230b, and 230c may penetrate the first and second interlayer insulating layers 180 and 210 and the interlayer insulating pattern 130 to be electrically connected to the gate electrodes 120a, 120b, and 120c, respectively. In some embodiments, the cell contact plugs 230a, 230b, and 230c may directly contact the upper surfaces of the end portions of the gate electrodes 120a, 120b, and 120c. The cell contact plugs 230a, 230b and 230c may include a first cell contact plug 230a, second cell contact plugs 230b, and a third cell contact plug 230c. In some embodiments, the first cell contact plug 230a may directly contact the ground selection gate electrode 120a, the second cell contact plugs 230b may directly contact the cell gate electrodes 120b, and the third cell contact plug 230c may directly contact the string selection gate electrode 120c. The cell contact plugs 230a, 230b, and 230c may include, for example, metal such as copper and/or tungsten, and/or metal nitride such as titanium nitride, tantalum nitride, and/or tungsten nitride.

In some embodiments, vertical thicknesses of the cell contact plugs 230a, 230b, and 230c may be different from one another. For example, in some embodiments, a vertical length (or height) SHa of the cell contact plug 230a may be substantially the same as vertical lengths (or heights) SHb of the second cell contact plugs 230b. The vertical lengths SHb of the second cell contact plugs 230b may be substantially equal to each other. The vertical length SHa of the first cell contact plug 230a may be greater than a vertical length (or height) SHc of the third cell contact plug 230c.

In some embodiments, the vertical thickness of the cell contact plugs 230a, 230b, and 230c may be substantially the same as one another. For example, the vertical length SHa of the cell contact plug 230a may be substantially the same as the vertical lengths SHb of the second cell contact plugs 230b. The vertical lengths SHb of the second cell contact plugs 230b may be substantially equal to each other. The vertical length SHa of the first cell contact plug 230a may be substantially the same as the vertical length SHc of the third cell contact plug 230c.

In some embodiments, the vertical lengths of the cell contact plugs 230a, 230b, and 230c may be less than the vertical thickness VH of each of the stack structures ST. For example, the vertical thickness VH of each stack structure ST may be greater than the vertical length SHa of the first cell contact plug 230a, the vertical length SHb of each of the second cell contact plugs 230b, and the vertical length SHc of the third cell contact plug 230c.

First and second peripheral contact plugs 240a and 240b may be disposed in the peripheral circuit region PR. The first peripheral contact plug 240a may penetrate the first and second interlayer insulating layers 180 and 210, the interlayer insulating pattern 130, and the peripheral insulating pattern 30 such that the first peripheral contact plug 240a may be disposed on and electrically connected to the source/drain regions 24. The second peripheral contact plug 240b may penetrate the first and second interlayer insulating layers 180 and 210, the interlayer insulating pattern 130, and the peripheral insulating pattern 30 such that the second peripheral contact plug 240b may be disposed on and electrically connected to the peripheral gate electrode 22. The first and second peripheral contact plugs 240a and 240b may include for example, metal such as copper and/or tungsten, and/or metal nitride such as titanium nitride, tantalum nitride and/or tungsten nitride.

In some embodiments, a vertical length (or height) H of the first peripheral contact plug 240a may be less than the vertical thickness VH of each of the stack structures ST (VH>H). Thus, the vertical length H of the first peripheral contact plug 240a may be less than the vertical lengths (or heights) of the vertical channel structures VC extending from the upper surface of the substrate 100 in the cell array region CAR. The vertical length H of the first peripheral contact plug 240a may be equal to or greater than the vertical lengths of the cell contact plugs 230a, 230b, and 230c.

Bit lines BL, first connection lines CL1, and second connection lines CL2 may be disposed on the second interlayer insulating layer 210. The bit lines BL may be electrically connected to the channel contact plugs 220. The bit lines BL may extend in the second direction Y and may intersect the stack structures ST. The first connection lines CL1 may be electrically connected to the cell contact plugs 230a, 230b, and 230c. The second connection lines CL2 may be electrically connected to the first and second peripheral contact plugs 240a and 240b.

Figure 5:
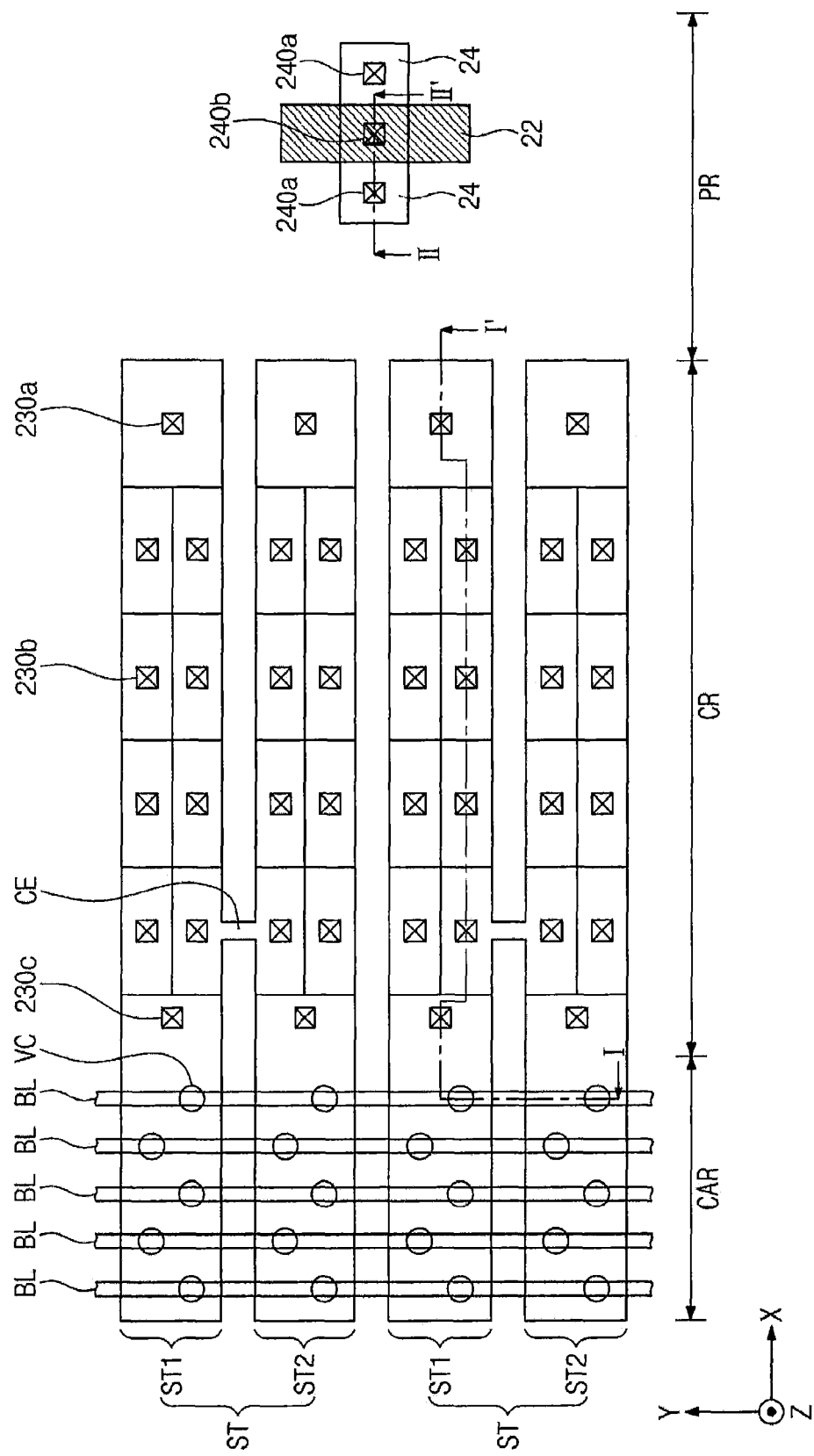
FIG. 5 is a plan view illustrating a three-dimensional semiconductor device according to example embodiments of the inventive concepts.
Figure 6A:
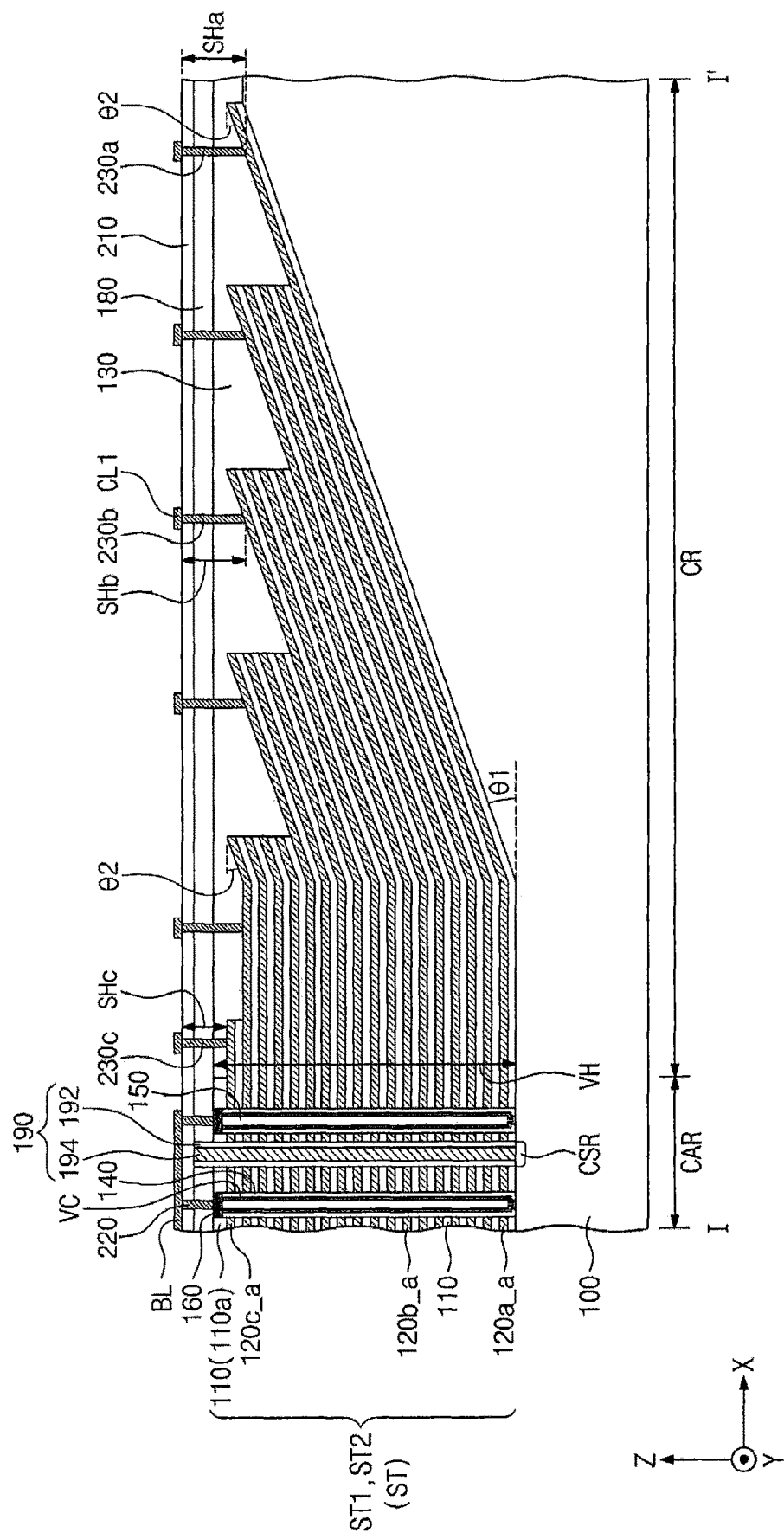
FIG. 6A illustrates a three-dimensional semiconductor device according to example embodiments of the inventive concepts, and is a cross-sectional view taken along line I-I' of FIG. 5.
Figure 6B:
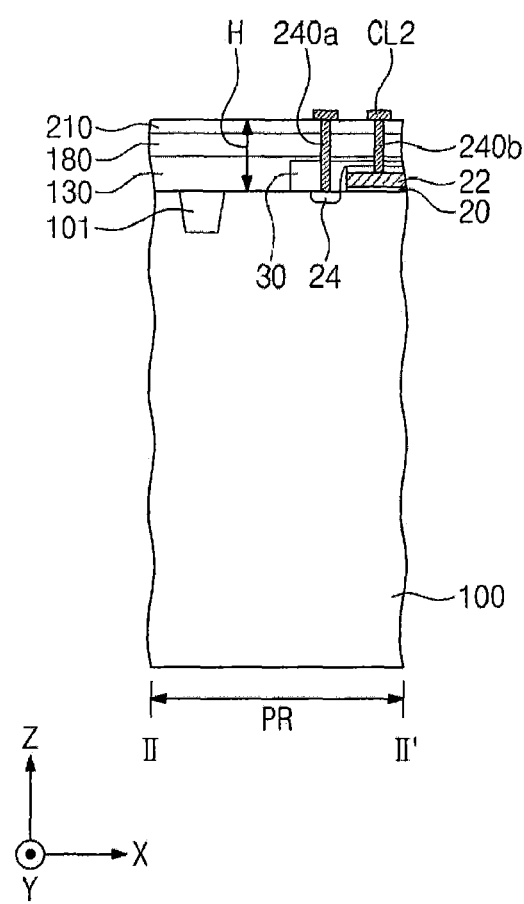
FIG. 6B illustrates a three-dimensional semiconductor device according to example embodiments of the inventive concepts, and is a cross-sectional view taken along line II-II' of FIG. 5.
Figure 7:
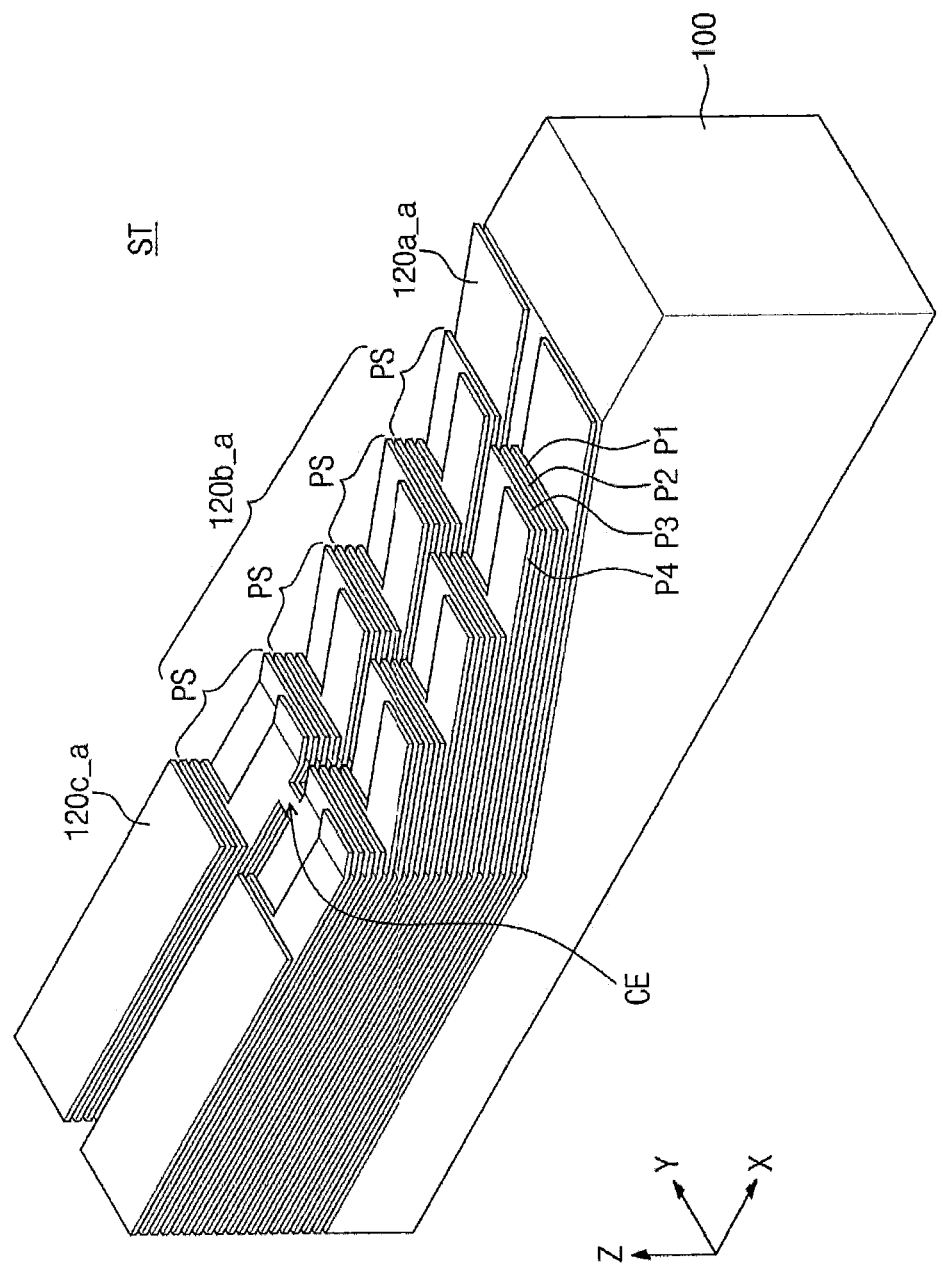
FIG. 7 is a perspective view illustrating end portions of gate electrodes disposed in a contact region of a substrate in a three-dimensional semiconductor device according to example embodiments of the inventive concepts.

FIG. 5 is a plan view illustrating a three-dimensional semiconductor device according to example embodiments of the inventive concepts. FIG. 6A illustrates a three-dimensional semiconductor device according to example embodiments of the inventive concepts, and is a cross-sectional view taken along line I-I' of FIG. 5. FIG. 6B illustrates a three-dimensional semiconductor device according to example embodiments of the inventive concepts, and is a cross-sectional view taken along line II-II' of FIG. 5. FIG. 7 is a perspective view illustrating end portions of gate electrodes disposed in a contact region of a substrate in a three-dimensional semiconductor device according to example embodiments of the inventive concepts. In FIGS. 5, 6A, 6B, and 7, the same reference numerals are used to denote the same or similar elements as in FIGS. 2, 3, and 4. Thus, repeated descriptions thereof are omitted.

Referring to FIGS. 5, 6A, 6B, and 7, the stack structures ST may include first stack structures ST1 and second stack structures ST2. The first stack structures ST1 and the second stack structures ST2 may be alternately disposed in the second direction Y. The first and second stack structures ST1 and ST2 may each include the gate electrodes 120a_a, 120b_a, and 120c_a that are sequentially stacked on the substrate 100. The first and second stack structures ST1 and ST2 may each include the ground selection gate electrode 120a_a, the string selection gate electrode 120c_a, and the cell gate electrodes 120b_a.

Among the cell gate electrodes 120b_a of a pair of first and second stack structures ST1 and ST2 adjacent in the second direction Y, at least two of the cell gate electrodes 120b_a positioned at the same level with respect to the upper surface of the substrate 100 in the contact region CR may be electrically connected to one another by a connection electrode CE. The connection electrode CE may extend in the second direction Y between the cell gate electrodes 120b_a that are parallel to each other in the first direction X and are positioned at the same level with respect to the upper surface of the substrate 100 in the contact region CR to physically and electrically connect the adjacent cell gate electrodes 120b_a. The connection electrode CE may not be provided between the ground selection gate electrodes 120a_a of a pair of first and second stack structures ST1 and ST2 adjacent in the second direction Y and/or between the string selection gate electrodes 120c_a thereof. The ground selection gate electrodes 120a_a adjacent in the second direction Y may be electrically isolated from each other, and the string selection gate electrodes 120c_a adjacent in the second direction Y may also be electrically isolated from each other.

The stack structures ST may each include a pair of ground selection gate electrodes 120a_a, a pair of string selection gate electrodes 120c_a on the pair of ground selection gate electrodes 120a_a, and a pair of cell gate electrodes 120b_a between the pair of the ground selection gate electrodes 120a_a and the pair of string selection gate electrodes 120c_a. A plurality of pairs of cell gate electrodes 120b_a may be sequentially stacked in the third direction Z vertical to the upper surface of the substrate 100 between the pair of the ground selection gate electrodes 120a_a and the pair of string selection gate electrodes 120c_a.

The pair of ground selection gate electrodes 120a a may extend in the first direction X and may be physically separated from each other in the second direction Y. The pair of the string selection gate electrodes 120c_a may extend in the first direction X and may be physically separated from each other in the second direction Y. The pair of cell gate electrodes 120b_a may extend in the first direction X and may be physically connected to each other by the connection electrode CE interposed therebetween.

As shown in FIG. 7, the pairs of cell gate electrodes 120b_a may include pad structures PS that are stacked in the third direction Z on the substrate 100 in the contact region CR. In some embodiments, the pad structures PS may be constituted by end portions of the plurality of pairs of cell gate electrodes 120b_a.

The pad structures PS may have different lengths in the first direction X. The lengths of the pad structures PS in the first direction X may decrease in a direction away from the upper surface of the substrate 100. For example, each of the pad structures PS may expose an upper surface of another pad structure PS located immediately thereunder. Upper surfaces of the pair of ground selection gate electrodes 120a_a may be exposed by a lowermost pad structure of the pad structures PS. The pair of string selection gate electrodes 12c_a. may expose upper surfaces of an uppermost pad structure of the pad structures PS. End portions of the stack structure ST may have a saw tooth shape in the contact region CR.

In some embodiments, each of the pad structures PS may include first to fourth pads P1, P2, P3 and P4. The first to fourth pads P1-P4 may be sequentially stacked on the substrate 100 in the third direction Z. Upper surfaces of the first to fourth pads P1-P4 of each of the pad structures PS may be exposed by another pad structure PS located immediately thereon. The first to fourth pads P1-P4 of each of the pad structures PS may have a stepped shape in the second direction Y. For example, the second pad P2 may expose a portion of the upper surface of the first pad P1. The third pad P3 may expose the portion of the upper surface of the first pad P1 and a portion of the upper surface of the second pad P2 which is adjacent in a horizontal direction (e.g., the second direction Y) relative to the portion of the upper surface of the first pad P1 and does not overlap the upper surface of the first pad P1. The fourth pad P4 may expose the portion of the upper surface of the first pad P1, the portion of the upper surface of the second pad P2, and a portion of the upper surface of the third pad P3 which is adjacent in the horizontal direction (e.g., the second direction Y) relative to the portion of the upper surface of the second pad P2 and does not overlap the upper surface of the second pad P2.

In some embodiments, the pad structures PS may each may include two pads or more than four pads (e.g., six, eight, or more pads).

The cell contact plugs 230a, 230b, and 230c may be disposed on portions of the upper surfaces of the first to fourth pads P1-P4, upper surfaces of end portions of the pair of ground selection gate electrodes 120a_a, and upper surfaces of end portions of the pair of string selection gate electrodes 120c_a. For example, first cell contact plugs 230a may be disposed on the upper surfaces of the end portions of the pair of ground selection gate electrodes 120a_a, and third cell contact plugs 230c may be disposed on the upper surfaces of the end portions of the pair of string selection gate electrodes 120c_a. Second cell contact plugs 230b may be disposed on the upper surfaces of ones of the first to fourth pads P1-P4 of the pad structures PS, respectively.

In some embodiments, vertical lengths (or heights) SHb of the second cell contact plugs 230b may be substantially equal to vertical lengths (or heights) SHa of the first cell contact plugs 230a. The vertical lengths SHb of the second cell contact plugs 230b may be substantially equal to one another. The vertical lengths SHb of the second cell contact plugs 230b may be greater than vertical lengths (or heights) SHc of the third cell contact plugs 230c.

In other embodiments, the vertical lengths SHa of the first cell contact plugs 230a, the vertical lengths SHb of the second cell contact plugs 230b, and the vertical lengths SHc of the third cell contact plugs 230c may be substantially the same as one another.

Figure 8:
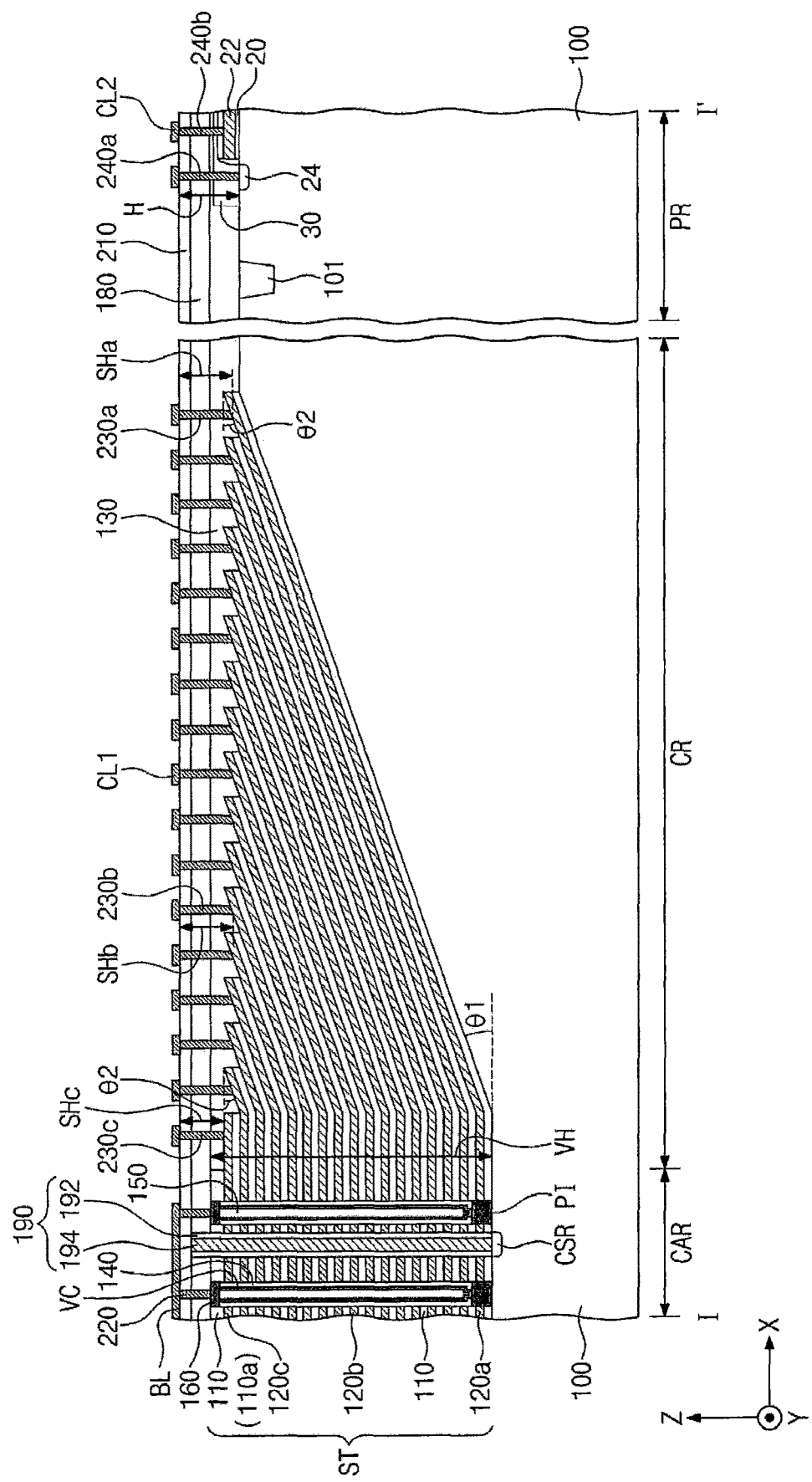
FIG. 8 illustrates a three-dimensional semiconductor device according to example embodiments of the inventive concepts, and is a cross-sectional view taken along line I-I' of FIG. 2.

FIG. 8 illustrates a three-dimensional semiconductor device according to example embodiments of the inventive concepts, and is a cross-sectional view taken along line I-I' of FIG. 2. In FIG. 8, the same reference numerals are used to denote the same elements as in FIGS. 2, 3, and 4. Thus, repeated descriptions thereof are omitted.

Referring to FIG. 8, semiconductor pillars PI may be disposed between the substrate 100 and the vertical channel structures VC. The vertical channel structures VC may be disposed on the substrate 100 and may penetrate the ground selection gate electrode 120a. The vertical channel structures VC and the semiconductor pillars PI may be electrically connected to each other. The semiconductor pillars PI may include a semiconductor material of the same conductivity type as that of the substrate 100 and/or an intrinsic semiconductor material. For example, the semiconductor pillars PI may include a monocrystalline intrinsic semiconductor material and/or a p-type semiconductor material.

Figure 9:
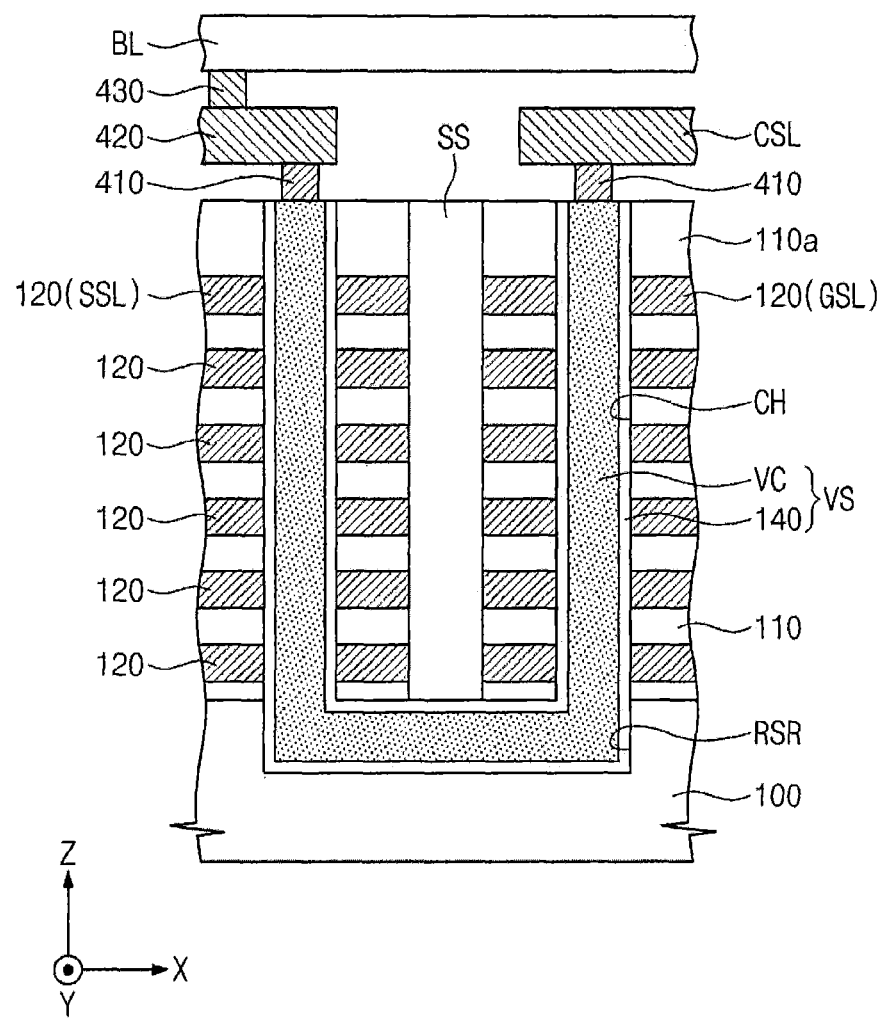
FIG. 9 is a cross-sectional view illustrating a three-dimensional semiconductor device according to example embodiments of the inventive concepts.

FIG. 9 is a cross-sectional view illustrating a three-dimensional semiconductor device according to example embodiments of the inventive concepts. Repeated descriptions of the same elements as those described with reference to FIGS. 1 to 8 are omitted.

Referring to FIG. 9, gate electrodes 120 may be separated in first direction X by a separation structure SS. An uppermost gate electrode of the gate electrodes 120 may include a string selection line SSL and a ground selection line GSL separated in the first direction X by the separation structure SS. A plurality of channel holes CH may be provided to penetrate the gate electrodes 120. A pair of channel holes CH spaced apart from each other in the first direction X may be connected to each other through a recess region RSR in the substrate 100. One channel hole CH penetrating the string selection line SSL may be connected to (or communicated with) another channel hole CH being adjacent thereto and penetrating the ground selection line GSL. Vertical structures VS may be provided in respective pairs of channel holes CH and respective recess regions RSR connecting the respective pairs of channel holes CH.

The vertical structures VS may each include a charge storage structure 140 and a vertical channel structure VC that are sequentially provided on an inner surface of each of the pairs of channel holes CH and an inner surface of each of the recess regions RSR. In some embodiments, the charge storage structure 140 may be on the periphery of the channel hole CH. A first contact 410 for connection to a bit line BL, a subsidiary conductive line 420, and a second contact 430 may be sequentially disposed on an end of each of the vertical channel structures VC penetrating the string selection line SSL. A common source line CSL may be connected to the other end of each of the vertical structures VS penetrating the ground selection line GSL, through the first contact 410.

FIGS. 10A to 10I illustrate a method of manufacturing a three-dimensional semiconductor device according to example embodiments of the inventive concepts, and are cross-sectional views taken along line I-I' of FIG. 2.

Referring to FIG. 10A, a substrate 100 may be prepared. The substrate 100 may include a cell array region CAR, a peripheral circuit region PR, and a contact region CR between the cell array region CAR and the peripheral circuit region PR. The substrate 100 may include a silicon substrate, a silicon-germanium substrate, a germanium substrate, or a monocrystalline epitaxial layer grown on a monocrystalline silicon substrate.

An isolation layer 101 may be formed in the substrate 100. For example, the isolation layer 101 may be formed in the substrate 100 between the peripheral circuit region PR and the contact region CR. The isolation layer 101 may define an active region of the substrate 100. The isolation layer 101 may include, for example, an insulating material such as silicon oxide.

Peripheral transistors may be disposed on the substrate 100 in the peripheral circuit region PR. The peripheral transistors may each include a peripheral gate insulating layer 20, a peripheral gate electrode 22, and/or source/drain regions 24. The peripheral gate insulating layer 20 may be formed on the substrate 100 in the peripheral circuit region PR. The peripheral gate electrode 22 may be formed on the peripheral gate insulating layer 20. The source/drain regions 24 may be formed in the substrate 100 at opposite sides of the peripheral gate electrode 22.

A peripheral insulating pattern 30 may be formed to be on and/or cover the peripheral transistors. The peripheral insulating pattern 30 may expose an upper surface of the substrate 100 in the cell array region CAR and the contact region CR. The peripheral insulating pattern 30 may include, for example, silicon oxide.

The substrate 100 in the cell array region CAR and the contact region CR may be formed to be recessed from the upper surface of the substrate 100 in the peripheral circuit region PR. As an example, a mask pattern exposing the upper surface of the substrate 100 in the cell array region CAR may be formed in the contact region CR and the peripheral circuit region PR, and then an upper portion of the substrate 100 in the cell array region CAR and the contact region CR may be etched using the mask pattern as an etch mask. A sidewall of the mask pattern may have a slope angle with respect to the upper surface of the substrate 100 in the peripheral circuit region PR. For example, the sidewall of the mask pattern may have an acute angle (e.g., about 10° to about 50°) with respect to the upper surface of the substrate 100 in the peripheral circuit region PR. Thus, the mask pattern may have a vertical thickness decreasing as extending from the peripheral circuit region PR to the contact region CR.

In some embodiments, the mask pattern may be etched while etching the upper surface of the substrate 100 in the cell array region CAR and the contact region CR. An etched amount of the substrate 100 in the contact region CR may be varied depending on the vertical thickness of the mask pattern. For example, since mask pattern is quickly removed from an thin portion of the mask pattern, the upper portion of the substrate 100 in the contact region CR adjacent to the cell array region CAR may be etched first, and the upper portion of the substrate 100 in the contact region CR adjacent to the peripheral circuit region PR may be etched later. An amount of the substrate 100 that is etched in the contact region CR may increase from a portion of the contact region CR adjacent to the peripheral circuit region PR to another portion of the contact region CR adjacent to the cell array region CAR. Thus, the upper surface of the substrate 100 in the contact region CR may have a first slope angle θ1 equal or similar to that of the sidewall of the mask pattern, with respect to the upper surface of the substrate 100 in the cell array region CAR. For example, the upper surface of the substrate 100 in the contact region CR may have an acute angle (e.g., about 10° to about 50°) with respect to the upper surface of the substrate 100 in the cell array region CAR.

In the example embodiments, the substrate 100 having the sloped plane may be formed using the mask pattern as described above, but is not limited thereto. The sloped upper surface of the substrate 100 in the contact region CR may be formed using other etching methods.

A mold structure MS may be formed on the substrate 100 in the cell array region CAR, the contact region CR, and the peripheral circuit region PR. The mold structure MS may be on and/or cover the upper surface of the substrate 100 in the cell array region CAR, the contact region CR, the peripheral circuit region PR, and an upper surface and a sidewall of the peripheral insulating pattern 30. The mold structure MS may include insulating layers 310 and sacrificial layers 320 that are repeatedly and alternately stacked on the substrate 100. The insulating layers 310 and the sacrificial layers 320 may include materials having an etching selectivity with respect to each other. For example, the insulating layers 310 may include, for example, silicon oxide, and the sacrificial layers 320 may include, for example, silicon nitride and/or silicon oxynitride. In some embodiments, the insulating layers 310 may include an uppermost insulating layer 310a.

In some embodiments, upper surfaces of the stacked insulating layers 310 and sacrificial layers 320 may have a second slope angle θ2 with respect to the upper surface of the substrate 100 in the cell array region CAR and/or the peripheral circuit region PR. For example, the second slope angle θ2 of the stacked insulating layers 310 and sacrificial layers 320 may be substantially equal to the first slope angle θ1 of the upper surface of the substrate 100 in the contact region CR. The second slope angle θ2 of the stacked insulating layers 310 and sacrificial layers 320 may have an acute angle (e.g., about 10° to about 50°).

Figure 10B:
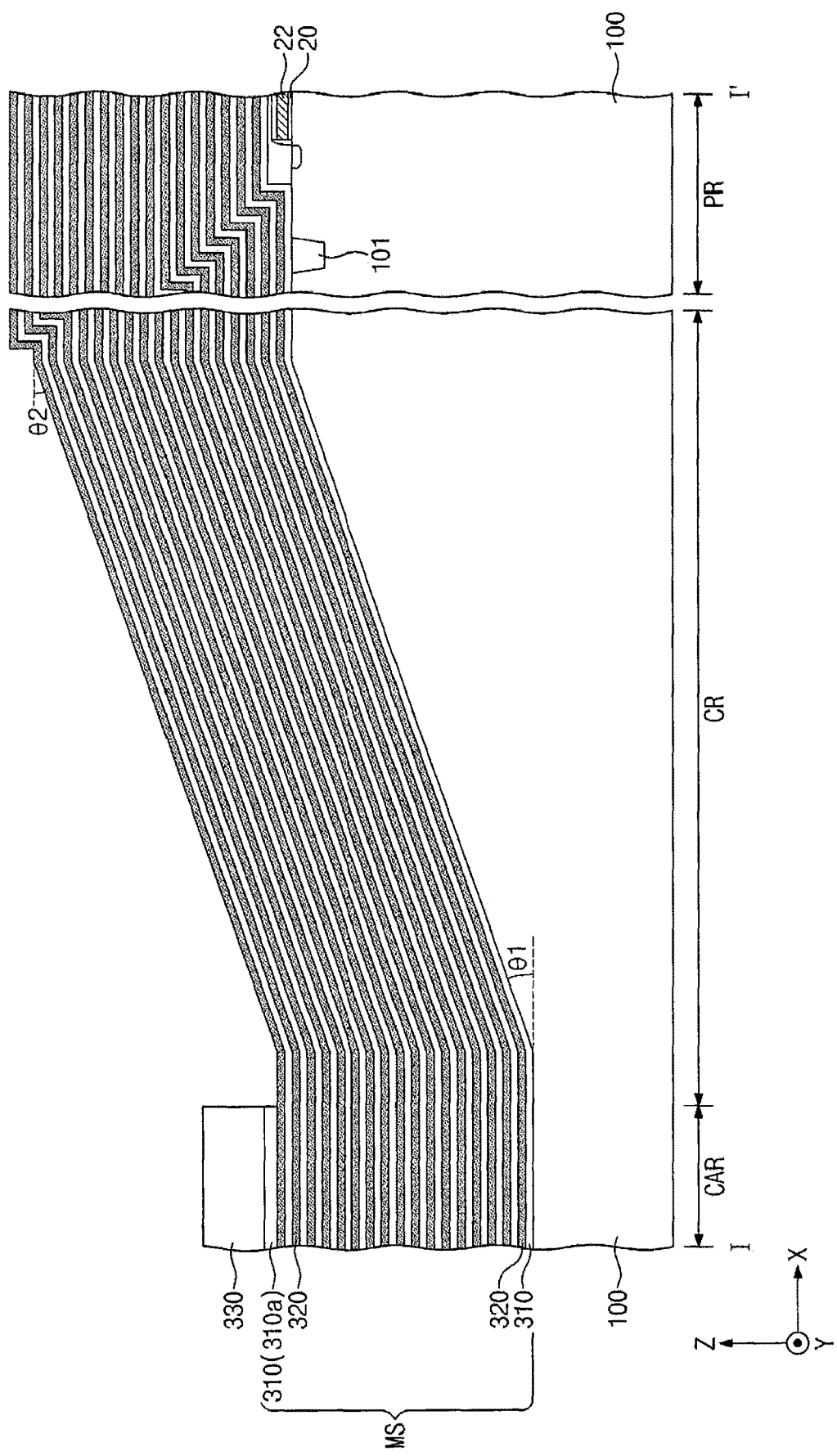

Referring to FIG. 10B, a first mask pattern 330 may be formed on the uppermost insulating layer 310a in the cell array region CAR. A first patterning process in which the uppermost insulating layer 310a is patterned using the first mask pattern 330 as an etching mask may be performed. The uppermost insulating layer 310a in the peripheral circuit region PR and the contact region CR may be etched by the first patterning process. Thus, an upper surface of the sacrificial layer 320 immediately below the uppermost insulating layer 310a may be exposed, and the patterned uppermost insulating layer 310a may locally remain in the cell array region CAR. Thereafter, the first mask pattern 330 may be removed.

Figure 10C:
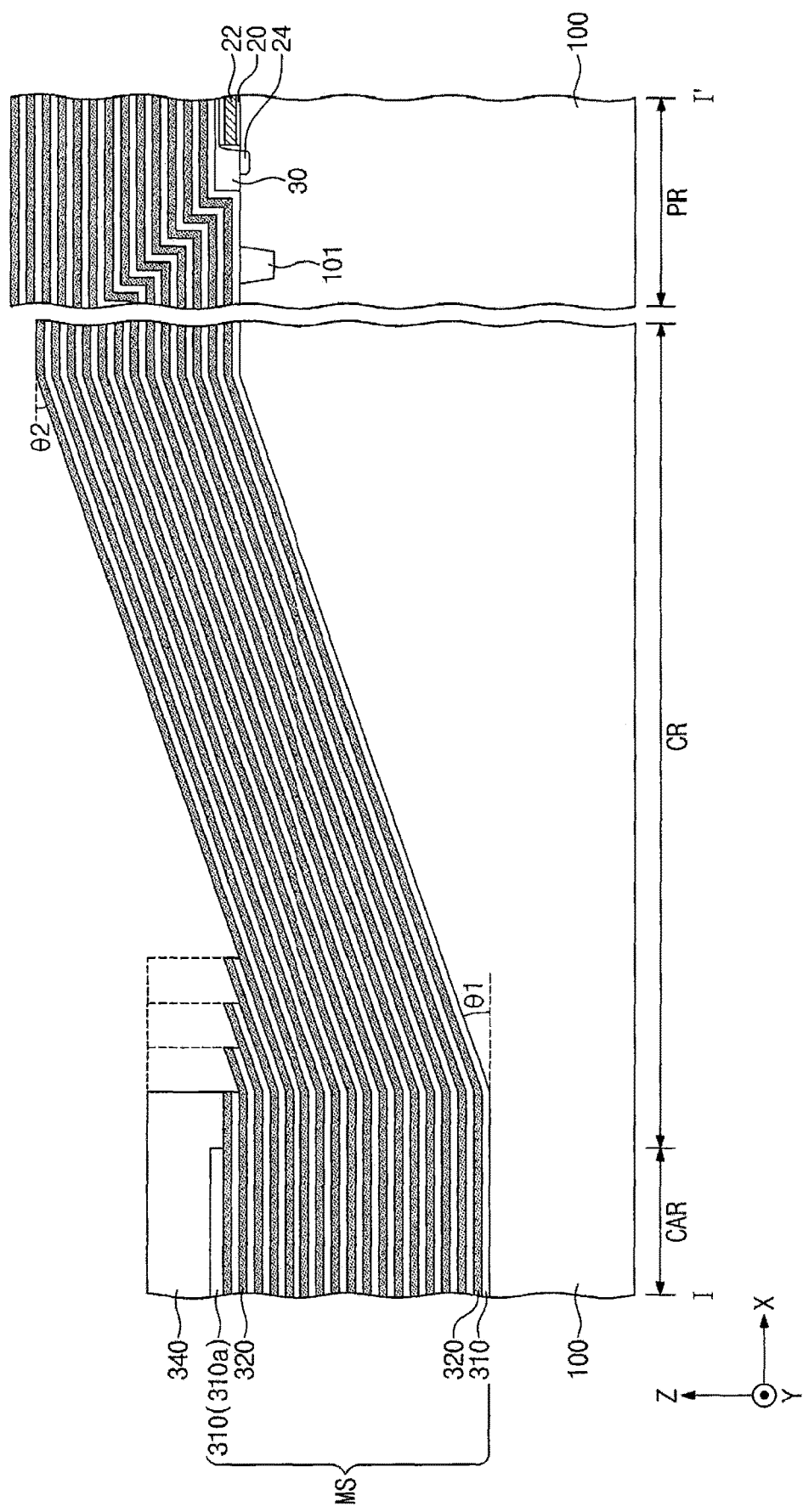

Referring to FIG. 10C, a second mask pattern 340 may be formed on the substrate 100 in the cell array region CAR and a portion of the contact region CR, A width of the second mask pattern 340 may be greater than a width of the first mask pattern 330. Thus, the second mask pattern 340 may cover an upper surface and a sidewall of the uppermost insulating layer 310a and a portion of the upper surface of the sacrificial layer 320 immediately below the uppermost insulating layer 310a. A second patterning process may be performed using the second mask pattern 340 as an etch mask to pattern some of the stacked sacrificial layers 320 and the insulating layers 310 which are below the patterned uppermost insulating layer 310a. The second patterning process may include repeatedly performing a process of etching at least one of the sacrificial layers 320 and the insulating layers 310 exposed by the second mask pattern 340 and a trimming process for enlarging a plan area of at least one of the sacrificial layers 320 and the insulating layers 310 to be etched by reducing the width of the second mask pattern 340. For example, the second patterning process of repeating the etching process and the trimming process four times may be performed as shown in the drawing.

In some embodiments, one etching process may include etching one sacrificial layer 320 exposed by the second mask pattern 340 and one insulating layer 310 immediately below the one sacrificial layer 320. Thus, each of the etched sacrificial layers 320 may have a length in a first direction X substantially equal to a length in the first direction X of the etched insulating layer 310 immediately below the etched sacrificial layer 320. An upper surface of an end portion of each sacrificial layer 320 may be exposed by the insulating layer 310 immediately thereon.

In other embodiments, one etching process may include etching a plurality of the insulating layers 310 and a plurality of the sacrificial layers 320. For example, the one etching process may include etching two sacrificial layers 320 and two insulating layers 310 that are alternately stacked. Thus, the two etched sacrificial layers 320 and the two etched insulating layers 310 may have substantially the same length in the first direction X. In some embodiments, the number of the layers etched once may be more than four (e.g., six, eight, or other even number). After performing the patterning process, the second mask pattern 340 may be removed.

Figure 10D:
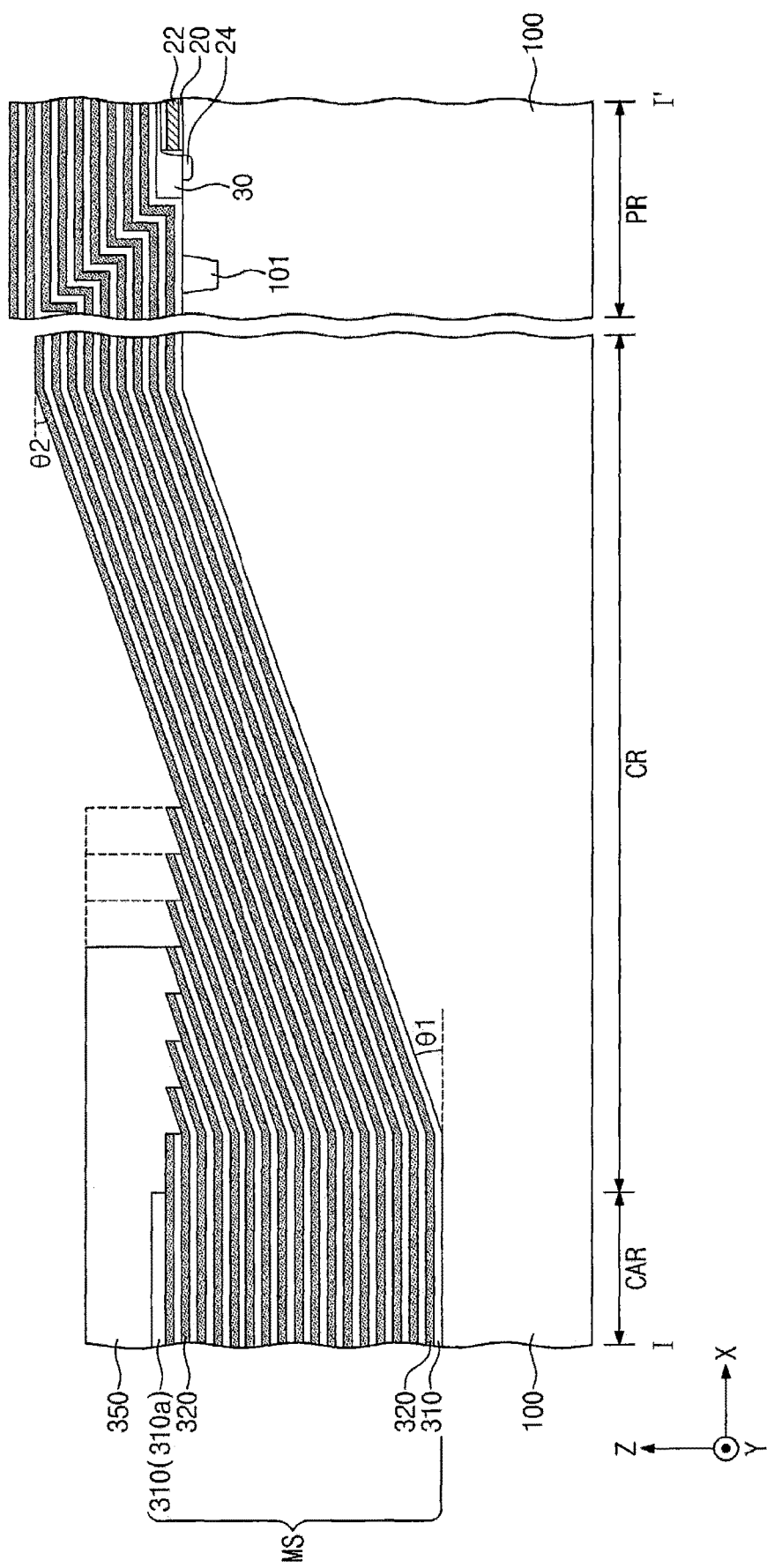

Referring to FIG. 10D, a third mask pattern 350 may be formed on the substrate 100 in the cell array region CAR and a portion of the contact region CR. A width of the third mask pattern 350 may be greater than the width of the second mask pattern 340. Thus, the third mask pattern 350 may be on and/or cover the upper surface and sidewall of the uppermost insulating layer 310a, upper surfaces and sidewalls of end portions of the sacrificial layers 320 patterned by the second patterning process, and sidewalls of the insulating layers 310 patterned by the second patterning process.

A third patterning process may be performed using the third mask pattern 350 as an etch mask to pattern some of the stacked sacrificial layers 320 and insulating layers 310 below a lowermost layer (e.g., the insulating layer 310) among the sacrificial layers 320 and the insulating layers 310 patterned by the second patterning process. The third patterning process may include repeating the etching process and the trimming process similar to those of the second patterning process described with reference to FIG. 10C. In some embodiments, the third patterning process may include repeating the etching process and the trimming process four times. After performing the third patterning process, the third mask pattern 350 may be removed.

Figure 10E:
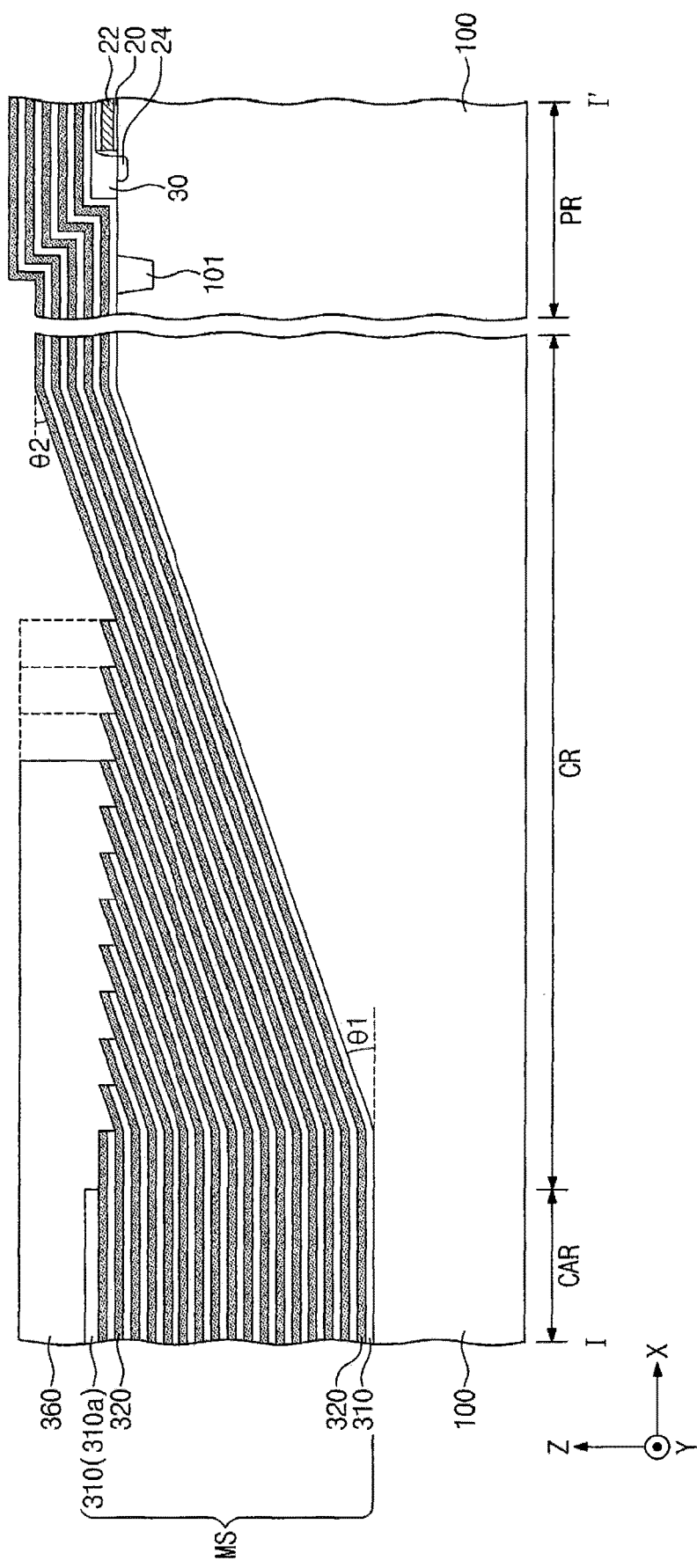

Referring to FIG. 10E, a fourth mask pattern 360 may be formed on the substrate 100 in the cell array region CAR and a portion of the contract region CR. A width of the fourth mask pattern 360 may be greater than the width of the third mask pattern 350. Thus, the fourth mask pattern 360 may be on and/or cover the upper surface and sidewall of the uppermost insulating layer 310a, upper surfaces and sidewalls of end portions of the sacrificial layers 320 patterned by the second and third patterning processes, and sidewalls of the insulating layers 310 patterned by the second and third patterning processes.

A fourth patterning process may be performed using the fourth mask pattern 360 as an etch mask to pattern some of the stacked sacrificial layers 320 and insulating layers 310 below a lowermost layer (e.g., the insulating layer 310) among the sacrificial layers 320 and the insulating layers 310 patterned by the third patterning process. The fourth patterning process may include repeating the etching process and the trimming process similar to those of the second and third patterning processes described with reference to FIGS. 10C and 10D. In some embodiments, the fourth patterning process may include repeating the etching process and the trimming process four times. After performing the fourth patterning process, the fourth mask pattern 360 may be removed.

Figure 10F:
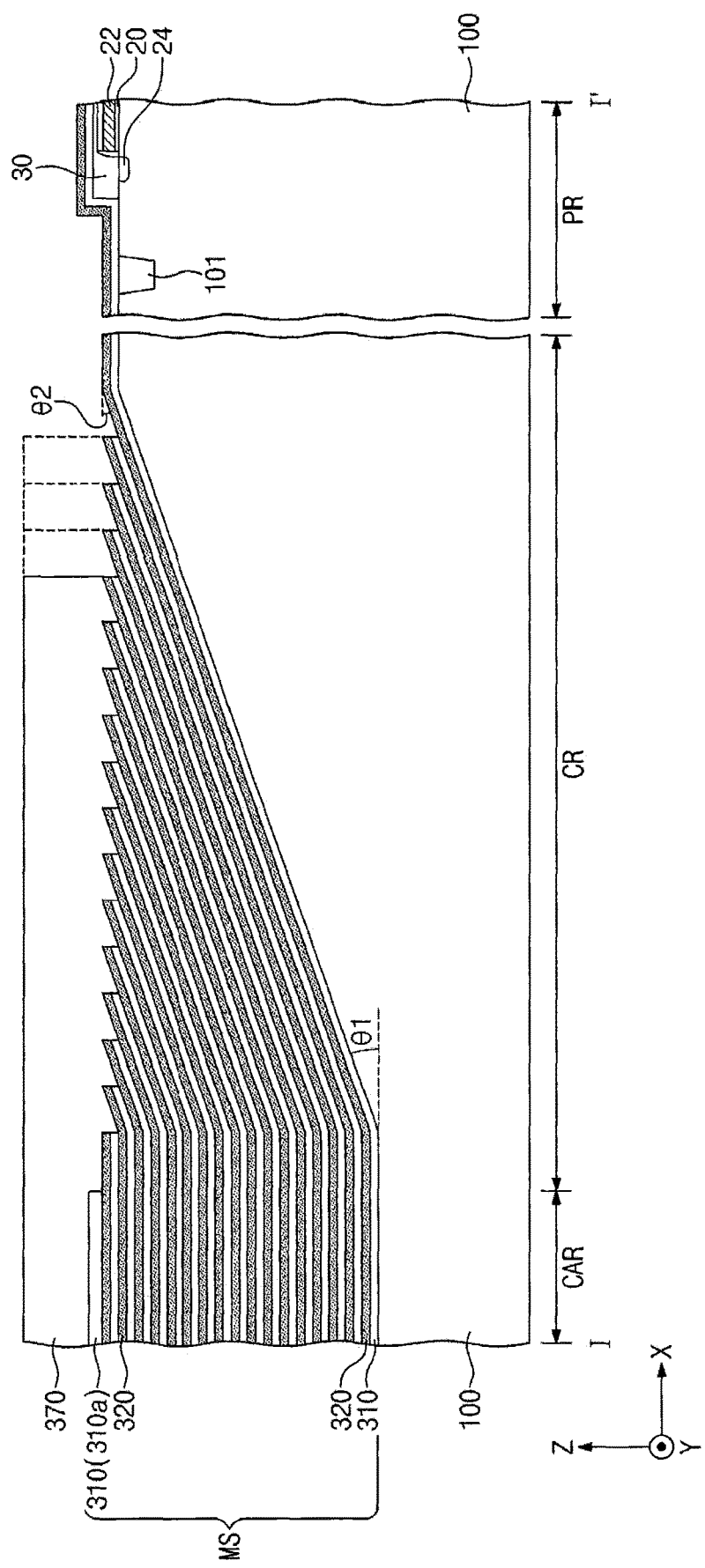

Referring to FIG. 10F, a fifth mask pattern 370 may be formed on the substrate 100 in the cell array region CAR and a portion of the contract region CR. A width of the fifth mask pattern 370 may be greater than the width of the fourth mask pattern 360. Thus, the fifth mask pattern 370 may be on and/or cover the upper surface and sidewall of the uppermost insulating layer 310a, upper surfaces and sidewalls of end portions of the sacrificial layers 320 patterned by the second to fourth patterning processes, and sidewalls of the insulating layers 310 patterned by the second to fourth patterning processes.

A fifth patterning process may be performed using the fifth mask pattern 370 as an etch mask to pattern some of the stacked sacrificial layers 320 and insulating layers 310 below a lowermost layer (e.g., the insulating layer 310) among the sacrificial layers 320 and the insulating layers 310 patterned by the fourth patterning process. The fifth patterning process may include repeating the etching process and the trimming process similar to those of the second to fourth patterning processes described with reference to FIGS. 10C to 10E. In some embodiments, the fifth patterning process may include repeating the etching process and the trimming process four times. After performing the fifth patterning process, the fifth mask pattern 370 may be removed.

Referring to FIG. 10G, a sixth mask pattern 380 may be formed on the substrate 100 in the cell array region CAR and the contract region CR. A width of the sixth mask pattern 380 may be greater than the width of the fifth mask pattern 370. Thus, the sixth mask pattern 380 may be on and/or cover the upper surface and sidewall of the uppermost insulating layer 310a, upper surfaces and sidewalls of end portions of the sacrificial layers 320 patterned by the second to fifth patterning processes, and sidewalls of the insulating layers 310 patterned by the second to fifth patterning processes.

The stacked sacrificial layers 320 and insulating layers 310 in the peripheral circuit region PR may be etched using the sixth mask pattern 380 as an etch mask. Thus, the upper surface of the substrate 100 in the peripheral circuit region PR and the peripheral insulating pattern 30 may be exposed, and the mold structure MS may locally remain on the substrate 100 in the cell array region CAR and the contact region CR. After the etching process, the sixth mask pattern 380 may be removed.

Figure 10H:
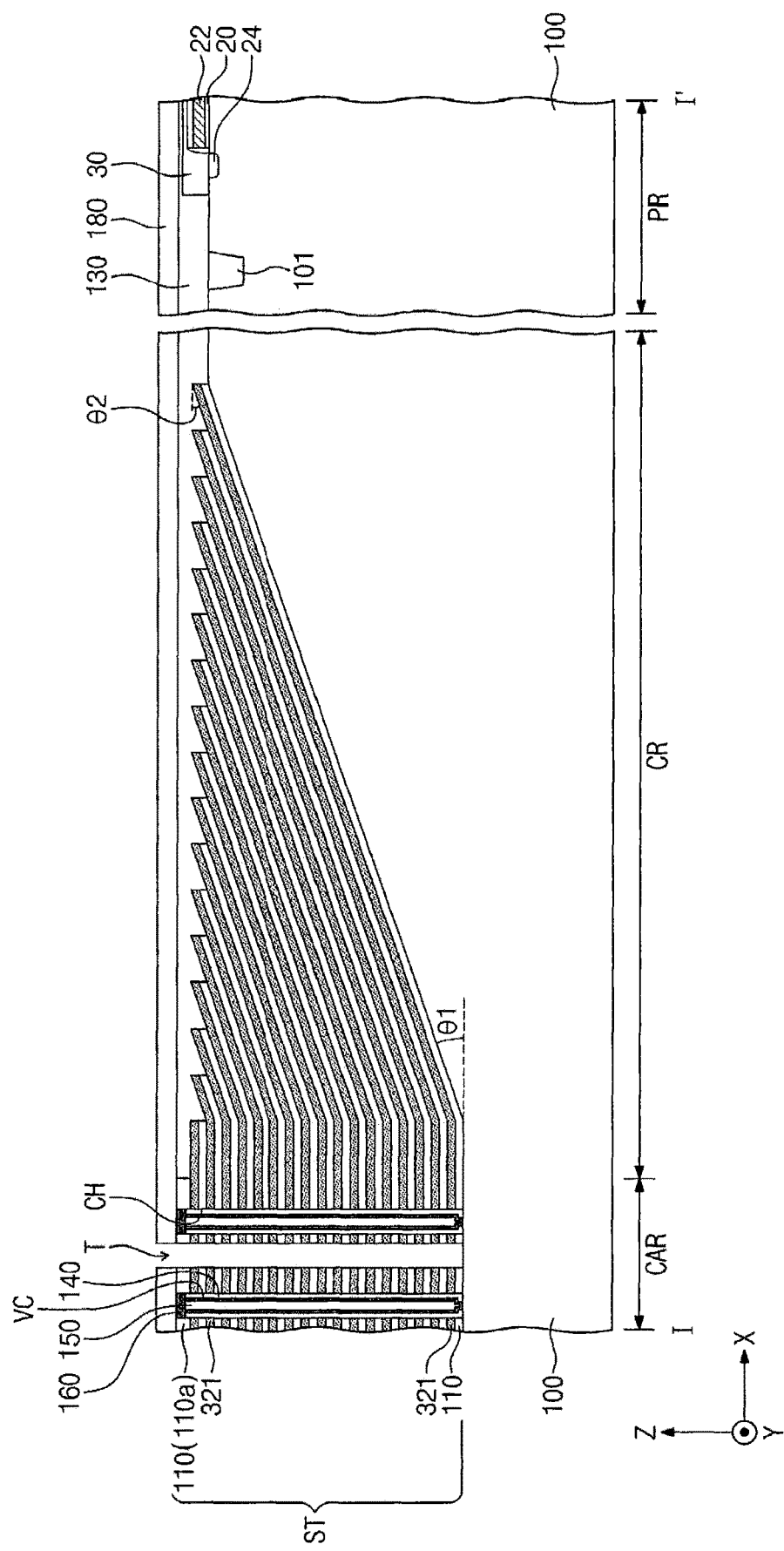

Referring to FIG. 10H, an interlayer insulating pattern 130 may be formed on the substrate 100 in the contact region CR and the peripheral circuit region PR. The interlayer insulating pattern 130 may be on and/or cover the upper surfaces and sidewalls of the end portions of the patterned sacrificial layers 320, the sidewalls of the patterned insulating layers 310, the upper surface of the substrate 100 in the peripheral circuit region PR, and the upper surface and the sidewall of the peripheral insulating pattern 30. The interlayer insulating pattern 130 may include, for example, silicon oxide.

A charge storage structure 140, a vertical channel structure VC, and a gap fill layer 150 may be formed in each of channel holes CH formed by patterning the mold structure MS. The channel holes CH may be formed by anisotropically etching the mold structure MS using a mask pattern on the uppermost insulating layer 310a and the interlayer insulating pattern 130 as an etch mask. Due to over-etching, the upper surface of the substrate 100 may be recessed. The channel holes CH may have a circular, elliptical, or polygonal shape when viewed in plan view.

The charge storage structure 140 may be formed on an inner sidewall of each of the channel holes CH. The charge storage structure 140 may cover the inner sidewall of each channel hole CH and a portion of the upper surface of the substrate 100 exposed by each channel hole CH. The charge storage structure 140 may include a blocking insulating layer BLL, a charge storage layer CTL, and a tunnel insulating layer TL which are sequentially formed on the inner sidewall of each channel hole CH. The blocking insulating layer BLL may include, for example, silicon oxide and/or a high-k dielectric material (e.g., aluminum oxide ($Al_2O_3$) and/or hafnium oxide ($HfO_3$)). The charge storage layer CTL may include, for example, silicon nitride. The tunnel insulating layer TL may include, for example, silicon oxide and/or a high-k dielectric material (e.g., aluminum oxide and/or hafnium oxide).

The vertical channel structure VC may be formed to conformally cover an inner sidewall of the charge storage structure 140 and the upper surface of the substrate 100 exposed by the charge storage structure 140. The vertical channel structure VC may include, for example, a semiconductor material. For example, the vertical channel structure VC may include a monocrystalline silicon layer, an organic silicon layer, and/or a carbon nano-structure.

The gap fill layer 150 may be formed in an inner space surrounded by the vertical channel structure VC. In some embodiments, the gap fill layer 150 may completely fill each of the channel holes CH. The gap fill layer 150 may be formed by, for example, a SOG coating process. The gap fill layer 150 may include an insulating material such as, for example, silicon oxide and/or silicon nitride. Before forming the gap fill layer 150, a hydrogen annealing process in which heat treatment is performed under a gas atmosphere containing hydrogen or deuterium may be further performed on the vertical channel structure VC. By the hydrogen annealing process, crystal defects in the vertical channel structure VC may be reduced and/or eliminated.

A pad 160 may be formed on the charge storage structure 140, the vertical channel structure VC, and the gap fill layer 150. The pad 160 may be formed by etching upper portions of the charge storage structure 140, the vertical channel structure VC, and the gap fill layer 150 to form a recess region and then filling the recess region with a conductive material. In some embodiments, the pad 160 may be formed by doping the upper portion of the vertical channel structure VC with impurities of different conductivity type from the vertical channel structure VC.

A common source trench T may be formed by performing an anisotropic etching process on the mold structure MS. The common source trench T may be formed by forming a first interlayer insulating layer 180 on the mold structure MS and patterning the mold structure MS using the first interlayer insulating layer 180 as an etch mask until exposing the upper surface of the substrate 100. The common source trench T may extend in the first direction X. Thus, the common source trench T may have a linear or rectangular shape extending in the first direction X. Stack structures ST may be formed on the substrate 100 to be separated from each other in the second direction Y by the common source trench T. The stack structures ST may each include insulating patterns 110 and 110a (the uppermost insulating pattern) and sacrificial patterns 321 which are alternately and repeatedly stacked on the substrate 100. Sidewalls of the stack structures ST may be exposed by the common source trench T.

Figure 10I:
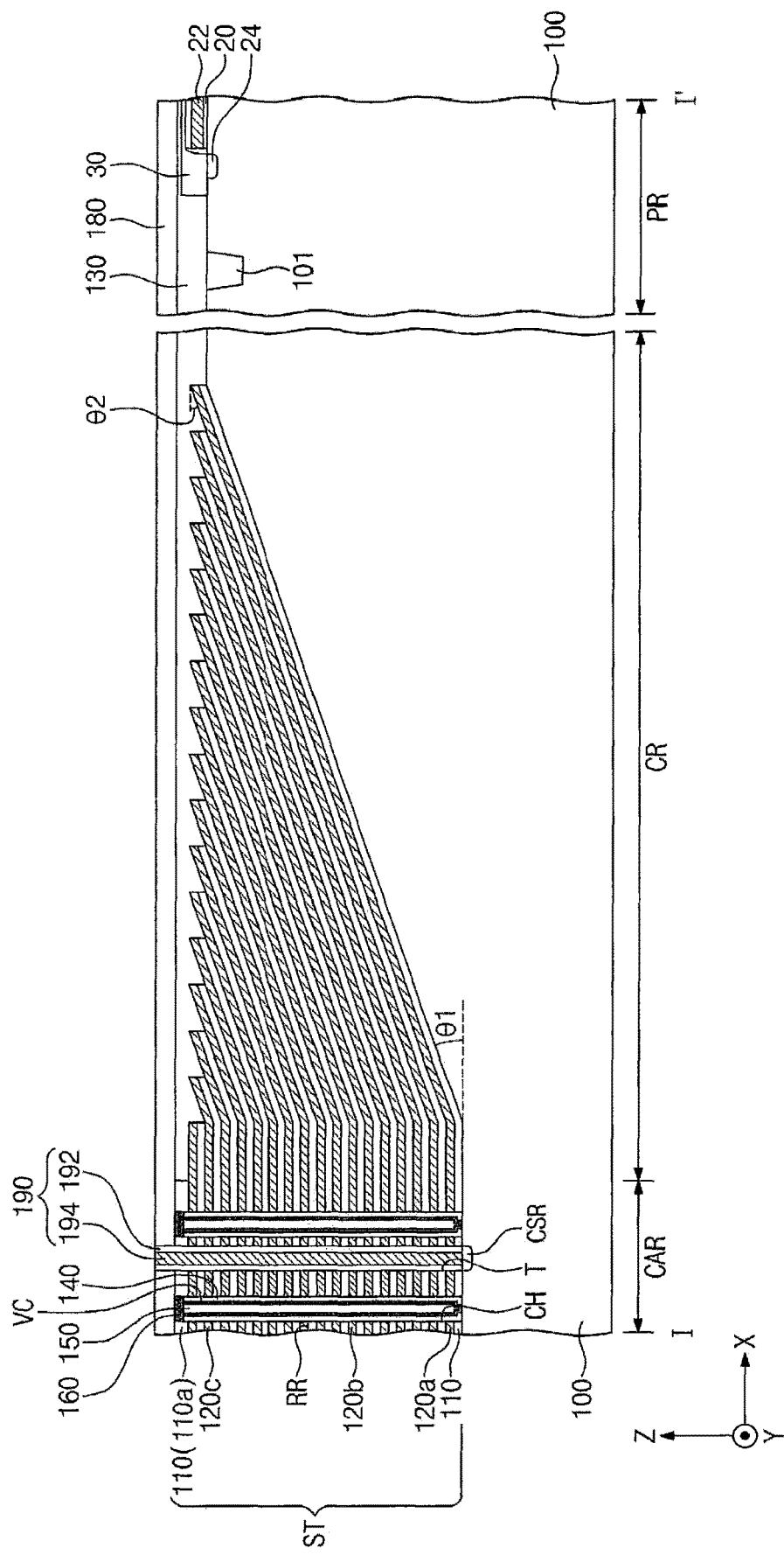

Referring to FIG. 10I, recess regions RR may be formed by removing the sacrificial patterns 321 exposed by the common source trench T. The sacrificial patterns 321 may be removed by a wet etching process and/or an isotropic dry etching process. The recess regions RR may be formed between the insulating patterns 110 and 110a. The etching process may be performed using an etchant containing phosphoric acid, for example. The recess regions RR may horizontally or laterally extend from the common source trench T to between the insulating patterns 110 and 110a. The recess regions RR may expose upper surfaces and lower surfaces of the insulating patterns 110 and 110a and a portion of an outer sidewall of the charge storage structure 140.

As shown in FIG. 4, a horizontal insulating layer 170 may be formed in the recess regions RR. For example, the horizontal insulating layer 170 may conformally extend on and/or cover the surfaces of the insulating patterns 110 and 110a, the outer sidewall of the charge storage structure 140 exposed by the recess regions RR, and sidewalls of the first interlayer insulating layer 180 exposed by the common source trench T. The horizontal insulating layer 170 may be formed by a deposition process with an improved step coverage property. For example, the horizontal insulating layer 170 may be formed by a chemical vapor deposition (CVD) process or an atomic layer deposition (ALD) process. The horizontal insulating layer 170 may include, for example, silicon oxide and/or a high-k dielectric layer (e.g., aluminum oxide and/or hafnium oxide).

A ground selection gate electrode 120a, cell gate electrodes 120b, and a string selection gate electrode 120c may be formed in the recess regions RR. The ground selection gate electrode 120a, the cell gate electrodes 120b, and the string selection gate electrode 120c may be formed by filling the common source trench T and the recess regions RR with metal and removing the metal formed in the common source trench T. The ground selection gate electrode 120a, the cell gate electrodes 120b, and the string selection gate electrode 120c may include metal (e.g., tungsten).

In some embodiments, upper surfaces of end portions of the cell gate electrodes 120b and an upper surface of an end portion of the ground selection gate electrode 120a in the contact region CR may have the second slope angle θ2 with respect to the upper surface of the substrate 100 in the cell array region CAR and/or the peripheral circuit region PR. For example, the upper surfaces of the end portions of the cell gate electrodes 120b and the upper surface of the end portion of the ground selection gate electrode 120a in the contact region CR may have an acute angle (e.g., about 10° to about 50°) with respect to the upper surface of the substrate 100 in the cell array region CAR and/or the peripheral circuit region PR. In some embodiments, an end portion of each of the stack structures ST may have a saw tooth shape.

Heights of the end portions of the cell gate electrodes 120b and a height of the end portion of the ground selection gate electrode 120a from the upper surface of the substrate 100 in the cell array region CAR and/or the peripheral circuit region PR may be substantially equal to one another. Maximum heights of the end portions of the cell gate electrodes 120b may be substantially equal to one another. In some embodiments, minimum heights of the end portions of the cell gate electrodes 120b may be substantially equal to one another. A maximum height of the end portion of the ground selection gate electrode 120a may be substantially equal to the maximum heights of the end portions of the cell gate electrodes 120b. In some embodiments, a minimum height of the end portion of the ground selection gate electrode 120a may be substantially equal to the minimum heights of the end portions of the cell gate electrodes 120b.

A common source region CSR may be formed in the substrate 100 exposed by the common source trench T. The common source region CSR may be formed by an ion-implantation process. The common source region CSR may have a different conductivity from that of the substrate 100.

A contact structure 190 may be formed in the common source trench T. The contact structure 190 may include a spacer 192 and a common source contact 194. The spacer 192 may extend on and/or cover an inner sidewall of the common source trench T. The common source contact 194 may be formed to be within and/or substantially fill a remaining space of the common source trench T in which the spacer 192 is formed. The spacer 192 may include, for example, silicon oxide and/or silicon nitride. The common source contact 194 may include, for example, metal (e.g., tungsten, copper and/or aluminum), conductive metal nitride (e.g., titanium nitride and/or tantalum nitride) and/or transition metal (e.g., titanium and/or tantalum).

Referring again to FIGS. 2 and 3, a second interlayer insulating layer 210 may be formed on the first interlayer insulating layer 180. The second interlayer insulating layer 210 may be on and/or cover an upper surface of the first interlayer insulating layer 180 and an upper surface of the contact structure 190. The second interlayer insulating layer 210 may include, for example, silicon oxide.

Channel contact plugs 220, first to third cell contact plugs 230a, 230b, and 230c and first and second peripheral contact plugs 240a and 240b may be formed on the substrate 100. For example, the channel contact plugs 220 may be formed to penetrate the first and second interlayer insulating layers 180 and 210 such that the channel contact plugs 220 may be formed on and connected to the pad 160. The first to third cell contact plugs 230a, 230b, and 230c may be formed to penetrate the first and second interlayer insulating layers 180 and 210 and the interlayer insulating pattern 130 such that the first to third cell contact plugs 230a, 230b, and 230c may be formed on and connected to the end portions of the ground selection, cell, and string selection gate electrodes 120a, 120b, and 120c in the contact region CR. The first peripheral contact plug 240a may be formed to penetrate the first and second interlayer insulating layers 180 and 210 and the interlayer insulating pattern 130 such that the first peripheral contact plug 240a may be formed on and connected to the source/drain regions 24 in the peripheral circuit region PR. The second peripheral contact plug 240b may be formed to penetrate the first and second interlayer insulating layers 180 and 210 and the interlayer insulating pattern 130 such that the second peripheral contact plug 240b may be formed on and connected to the peripheral gate electrode 22 in the peripheral circuit region PR.

In some embodiments, the channel contact plugs 220, the first to third cell contact plugs 230a, 230b, and 230c, and the first and second peripheral contact plugs 240a and 240b may be formed by the same etching process. In other embodiments, the first to third cell contact plugs 230a, 230b, and 230c and the first and second peripheral contact plugs 240a and 240b may be formed by the same etching process, and the channel contact plugs 220 may be formed by a separate etching process. The channel contact plugs 220, the first to third cell contact plugs 230a, 230b, and 230c, and the first and second peripheral contact plugs 240a and 240b may include metal (e.g., copper and/or tungsten) and/or metal nitride (e.g., titanium nitride, tantalum nitride and/or tungsten nitride).

In some embodiments, since the upper surfaces of the end portions of the cell gate electrodes 120b and the upper surface of the end portion of the ground selection gate electrode 120a are positioned at the same height from the upper surface of the substrate 100 in the cell array region CAR and/or the peripheral circuit region PR, the first and second cell contact plugs 230a and 230b disposed on the end portions of the cell gate electrodes 120b and the end portion of the ground selection gate electrode 120a may have substantially the same vertical thicknesses. For example, vertical lengths (or heights) SHb of the second cell contact plug 230b may be substantially equal to a vertical length (or height) SHa of the first cell contact plug 230a. In some embodiments, the vertical lengths SHa and SHb of the first and second cell contact plugs 230a and 230b may be smaller than the vertical thickness VH of the stack structure ST. A vertical length (or height) SHc of the third cell contact plug 230c may be smaller than the vertical thickness VH of the stack structure ST.

In some embodiments, a vertical thickness H of the first peripheral contact plug 240a may be smaller than the vertical thickness VH of the stack structure ST. For example, a vertical length (or height) H of the first peripheral contact plug 240a may be smaller than the vertical thickness VH of the stack structure ST (VH>H).

According to the example embodiments of the inventive concepts, the upper surface of the substrate 100 in the contact region CR may be formed at an acute angle with respect to the upper surface of the substrate 100 in the peripheral circuit region PR and/or the cell array region CAR such that the upper surfaces of the end portions of the ground selection gate electrode 120a and the cell gate electrodes 120b may be formed at the acute angle with respect to the upper surface of the substrate 100 in the peripheral circuit region PR and/or the cell array region CAR. The vertical lengths SHa and SHb of the first and second cell contact plugs 230a and 230b on the upper surfaces of the end portions of the ground selection gate electrode 120a and the cell gate electrodes 120b may be substantially the same. Accordingly, an etching problem caused by a difference in the vertical lengths of the first to third cell contact plugs 230a, 230b, and 230c may be improved.

According to the example embodiments of the inventive concepts, the upper surface of the substrate 100 in the cell array region CAR and the contact region CR may be positioned at a lower level than the upper surface of the substrate 100 in the peripheral circuit region PR such that the vertical lengths SHa and SHb of the first and second cell contact plugs 230a and 230b, the vertical height SHc of the third cell contact plug 230c, and the vertical lengths H of the first and second peripheral contact plugs 240a and 240b may be smaller than the vertical thickness VH of the stack structure ST. Accordingly, since a difference in the vertical lengths SHa and SHb of the first and second cell contact plugs 230a and 230b, the vertical length SHc of the third cell contact plug 230c, and the vertical length H of the first peripheral contact plug 240a is reduced, the first to third cell contact plugs 230a, 230b, and 230c and the first peripheral contact plug 240a may be simultaneously formed by the same etching process.

Bit lines BL and first and second connection lines CL1 and CL2 may be formed on the second interlayer insulating layer 210. The bit lines BL may be electrically connected to the channel contact plugs 220. The first connection lines CL may be electrically connected to the first to third cell contact plugs 230a, 230b, and 230c. The second connection lines CL2 may be electrically connected to the first and second peripheral contact plugs 240a and 240b.

While the present inventive concepts have been particularly shown and described with reference to example embodiments thereof, it will be understood by those of ordinary skill in the art that various changes in form and details may be made therein without departing from the spirit and scope of the present disclosure as defined by the following claims.

What is claimed is:

1. A three-dimensional semiconductor memory device comprising:
    a substrate comprising a cell array region and a contact region;
    a stack structure comprising gate electrodes sequentially stacked on the substrate;
    vertical structures penetrating the stack structure; and
    cell contact plugs in contact with upper surfaces of end portions of the gate electrodes in the contact region,
    wherein the upper surfaces of the end portions of the gate electrodes in the contact region have a first acute angle with respect to an upper surface of the substrate in the cell array region,
    wherein a lower surface of each of the cell contact plugs is located at a level higher than that of a lower surface of each of the gate electrodes connected thereto.

2. The three-dimensional semiconductor memory device of claim 1, wherein the gate electrodes comprise an uppermost gate electrode,
    wherein the stack structure further comprises first insulating patterns between the gate electrodes and a second insulating pattern on the uppermost gate electrode, and
    wherein an upper surface of the second insulating pattern is positioned at a higher level than the upper surfaces of the end portions of the gate electrodes with respect to the upper surface of the substrate.

3. The three-dimensional semiconductor memory device of claim 1, wherein the substrate further comprises a peripheral circuit region adjacent to the contact region, and
    wherein an uppermost portion of the upper surfaces of the end portions of the gate electrodes are at a higher level than the upper surface of the substrate in the peripheral circuit region.

4. The three-dimensional semiconductor memory device of claim 1, wherein the substrate further comprises a peripheral circuit region, the contact region disposed between the cell array region and the peripheral circuit region,
    wherein the upper surface of the substrate in the cell array region is positioned at a lower level than the upper surface of the substrate in the peripheral circuit region, and
    wherein the upper surface of the substrate in the contact region has a second acute angle with respect to the upper surface of the substrate in the cell array region and extends from the upper surface of the substrate in the peripheral circuit region to the upper surface of the substrate in the cell array region.

5. The three-dimensional semiconductor memory device of claim 1, wherein the end portions of the gate electrodes in the contact region are substantially equidistant from a plane that includes the upper surface of the substrate in the cell array region.

6. The three-dimensional semiconductor memory device of claim 1, wherein the substrate further comprises a peripheral circuit region adjacent to the contact region, the contact region disposed between the cell array region and the peripheral circuit region.

7. The three-dimensional semiconductor memory device of claim 6, further comprising:
    a peripheral gate electrode in the peripheral circuit region;
    source/drain regions in the substrate at opposite sides of the peripheral gate electrode; and
    a peripheral contact plug connected to at least one of the source/drain regions,
    wherein a vertical length of the peripheral contact plug is smaller than a vertical length of the stack structure.

8. The three-dimensional semiconductor memory device of claim 1, wherein the gate electrodes comprise a lowermost gate electrode,
    wherein the cell contact plugs comprise a first cell contact plug connected to an end portion of the lowermost gate electrode, and
    wherein a vertical length of the first cell contact plug is smaller than a vertical length of the stack structure.

9. The three-dimensional semiconductor memory device of claim 1, wherein the gate electrodes comprise a lowermost gate electrode, an uppermost gate electrode, and intermediate gate electrodes between the lowermost gate electrode and the uppermost gate electrode,
    wherein the cell contact plugs comprise a first cell contact plug connected to the end portion of the lowermost gate electrode and second cell contact plugs connected to the end portions of respective ones of the intermediate gate electrodes, and
    wherein a vertical length of the first cell contact plug is substantially equal to vertical lengths of the second cell contact plugs.

10. The three-dimensional semiconductor memory device of claim 1, wherein the gate electrodes comprise an uppermost gate electrode,
    wherein the substrate further comprises a peripheral circuit region, and
    wherein the stack structure further comprises an uppermost insulating pattern on the uppermost gate electrode.

11. The three-dimensional semiconductor memory device of claim 10, further comprising:
    an interlayer insulating pattern in the contact region and the peripheral circuit region, an upper surface of the interlayer insulating pattern substantially coplanar with an upper surface of the uppermost insulating pattern,
    wherein a vertical length of the stack structure is greater than a height of the interlayer insulating pattern from the upper surface of the substrate in the peripheral circuit region.

12. The three-dimensional semiconductor memory device of claim 1, wherein the stack structure comprises a plurality of stack structures, wherein the plurality of stack structures comprise a first stack structure and a second stack structure spaced apart from each other in a first direction, wherein the first stack structure and the second stack structure comprise the gate electrodes, and wherein at least two of the gate electrodes adjacent in the first direction and positioned at a same level with respect to the upper surface of the substrate in the contact region are connected to each other by a connection electrode interposed therebetween at the same level.

13. The three-dimensional semiconductor memory device of claim 1, wherein the gate electrodes extend in a first direction, the gate electrodes comprising pad structures which are constituted by the end portions of the gate electrodes and are vertically stacked on the substrate in the contact region, wherein the pad structures comprise a first pad and a second pad which are sequentially stacked on the substrate, and wherein the second pad exposes a portion of an upper surface of the first pad that is adjacent the second pad in a second direction crossing the first direction.

14. A three-dimensional semiconductor memory device comprising:

a substrate comprising a cell array region, a peripheral circuit region, and a contact region between the cell array region and the peripheral circuit region, the substrate in the cell array region and the contact region having an upper surface recessed from an upper surface of the substrate in the peripheral circuit region;

a stack structure comprising gate electrodes sequentially stacked on the substrate in the cell array region and the contact region;

vertical structures penetrating the stack structure; and cell contact plugs in contact with respective upper surfaces of end portions of the gate electrodes in the contact region, wherein the upper surfaces of the end portions of the gate electrodes are positioned at a different level from the upper surface of the substrate in the peripheral circuit region, wherein the cell contact plugs have a substantially same vertical length, wherein the end portions of the gate electrodes in the contact region are substantially equidistant from a plane that includes the upper surface of the substrate in the cell array region, wherein the upper surfaces of the end portions of the gate electrodes are sloped with respect to the plane that includes the upper surface of the substrate in the cell array region, and wherein respective sidewalls of the end portions of the gate electrodes are substantially perpendicular with respect to the plane that includes the upper surface of the substrate in the cell array region.

15. The three-dimensional semiconductor memory device of claim 14, wherein the upper surface of the substrate in the cell array region is parallel to the upper surface of the substrate in the peripheral circuit region, and wherein the upper surface of the substrate in the contact region has an acute angle with respect to the upper surface of the substrate in the cell array region and the peripheral circuit region.

16. A three-dimensional semiconductor memory device comprising:

a substrate comprising a cell array region and a contact region;

a plurality of gate electrodes stacked on the substrate and extending from the cell array region to the contact region; and a plurality of first cell contact plugs, respective ones of the plurality of first cell contact plugs connected to respective ones of the plurality of gate electrodes in the contact region, wherein the respective ones of the plurality of first cell contact plugs extend a substantially equal distance to connect to the respective ones of the plurality of gate electrodes in the contact region, and wherein lowermost surfaces of the respective ones of the plurality of first cell contact plugs are inclined with respect to a lowermost surface of the substrate.

17. The three-dimensional semiconductor memory device of claim 16, further comprising:

a vertical structure penetrating the plurality of gate electrodes in the cell array region, wherein a second height of the vertical structure is greater than a first height of the plurality of first cell contact plugs.

18. The three-dimensional semiconductor memory device of claim 17, wherein the substrate further comprises a peripheral circuit region, wherein a first upper surface of the substrate in the contact region is inclined with respect to a second upper surface of the substrate in the cell array region, and wherein the first upper surface of the substrate extends from a first level coplanar with the second upper surface of the substrate in the cell array region to a second level coplanar with a third upper surface of the substrate in the peripheral circuit region.

19. The three-dimensional semiconductor memory device of claim 16, wherein the plurality of gate electrodes is a plurality of first gate electrodes, and further comprising:

a second gate electrode on the plurality of first gate electrodes; and a second cell contact plug connected to the second gate electrode in the contact region, wherein a second height of the second cell contact plug is smaller than a first height of the plurality of first cell contact plugs.

20. The three-dimensional semiconductor memory device of claim 2, wherein a first cell contact plug of the cell contact plugs that is in contact with the upper surface of the end portion of the uppermost gate electrode of the gate electrodes has a smaller height than a second cell contact plug of the cell contact plugs that is in contact with the upper surface of the end portion of a second gate electrode of the gate electrodes.

* * * * *